(12) United States Patent
Wegener

(10) Patent No.: US 9,026,568 B2
(45) Date of Patent: May 5, 2015

(54) DATA COMPRESSION FOR DIRECT MEMORY ACCESS TRANSFERS

(75) Inventor: Albert W. Wegener, Aptos Hills, CA (US)

(73) Assignee: Altera Corporation, San Jose, CA (US)

( * ) Notice: Subject to any disclaimer, the term of this patent is extended or adjusted under 35 U.S.C. 154(b) by 336 days.

(21) Appl. No.: 13/617,205

(22) Filed: Sep. 14, 2012

(65) Prior Publication Data
US 2013/0262538 A1 Oct. 3, 2013

Related U.S. Application Data

(60) Provisional application No. 61/618,534, filed on Mar. 30, 2012.

(51) Int. Cl.
*G06F 7/00* (2006.01)
*G06F 13/28* (2006.01)
*H03M 7/30* (2006.01)

(52) U.S. Cl.
CPC *G06F 13/28* (2013.01); *H03M 7/30* (2013.01)

(58) Field of Classification Search
CPC ....... H03M 7/30; H04N 7/26106; H04N 7/50; H04N 7/30; G06T 9/005
USPC ......................................................... 708/203
See application file for complete search history.

(56) References Cited

U.S. PATENT DOCUMENTS

| | | |
|---|---|---|
| 5,768,445 A | 6/1998 | Troeller et al. |
| 5,839,100 A | 11/1998 | Wegener |
| 5,974,471 A | 10/1999 | Belt |
| 6,195,024 B1 | 2/2001 | Fallon |
| 6,309,424 B1 | 10/2001 | Fallon |
| 6,317,747 B1 * | 11/2001 | Bolan et al. ..................... 710/68 |
| 6,597,812 B1 | 7/2003 | Fallon et al. |
| 6,862,662 B1 | 3/2005 | Cloud |
| 7,009,533 B1 | 3/2006 | Wegener |
| 7,129,860 B2 | 10/2006 | Alvarez, II et al. |
| 7,378,992 B2 | 5/2008 | Fallon |
| 8,204,106 B2 | 6/2012 | Sadowski et al. |

(Continued)

FOREIGN PATENT DOCUMENTS

| | | |
|---|---|---|
| KR | 10-0574415 B1 | 12/2006 |
| WO | 2007135602 A1 | 11/2007 |

OTHER PUBLICATIONS

Altior Whitepaper, "AltraFlex Compression File System Accelerator," www.altior.com, 3rd Quarter 2011, 5 pages.

(Continued)

*Primary Examiner* — Tan V. Mai
(74) *Attorney, Agent, or Firm* — Okamoto & Benedicto LLP

(57) ABSTRACT

Memory system operations are extended for a data processor by DMA, cache, or memory controller to include a DMA descriptor, including a set of operations and parameters for the operations, which provides for data compression and decompression during or in conjunction with processes for moving data between memory elements of the memory system. The set of operations can be configured to use the parameters and perform the operations of the DMA, cache, or memory controller. The DMA, cache, or memory controller can support moves between memory having a first access latency, such as memory integrated on the same chip as a processor core, and memory having a second access latency that is longer than the first access latency, such as memory on a different integrated circuit than the processor core.

50 Claims, 20 Drawing Sheets

(56) References Cited

U.S. PATENT DOCUMENTS

| | | | |
|---|---|---|---|
| 2002/0038393 | A1* | 3/2002 | Ganapathy et al. ............. 710/22 |
| 2002/0073298 | A1 | 6/2002 | Geiger et al. |
| 2005/0204081 | A1 | 9/2005 | Wang |
| 2007/0067483 | A1 | 3/2007 | Fallon |
| 2009/0089454 | A1 | 4/2009 | Huggahalli et al. |
| 2011/0078222 | A1 | 3/2011 | Wegener |
| 2011/0099295 | A1 | 4/2011 | Wegener |
| 2012/0072618 | A1 | 3/2012 | Fujimoto |
| 2013/0007076 | A1 | 1/2013 | Wegener |

OTHER PUBLICATIONS

Bauer, Michael, Henry Cook, and Brucek Khailany. Slide presentation "CudaDMA: Optimizing GPU Memory Bandwidth via Warp Specialization," presented at High Performance Computing, Networking, Storage and Analysis (SC), Nov. 12-18, 2011 International Conference for, 31 pages.

Benini, L et al. "Memory Energy Minimization by Data Compression: Algorithms, Architectures and Implementation." IEEE Transactions on Very Large Scale Integration (VLSI) Systems, vol. 12, No. 3, Mar. 2004, pp. 255-268.

Filgueira et al., Adaptive-Compi: Enhancing Mpi-Based Applications' Performance and Scalability by using Adaptive Compression, International Journal of High Performance Computing Applications, Jul. 26, 2010 at http://hpc.sagepub.com/content/25/1/93, 23 pages.

Filgueira, R., et al., "Exploiting data compression in collective I/O techniques," Cluster Computing, 2008 IEEE International Conference on, Sep. 29, 2008-Oct. 1, 2008, pp. 479-485.

Glaskowsky, Peter, white paper, "NVIDIA's Fermi: The First Complete GPU Computer Architecture," Sep. 2009, 26 pages.

Hammel, Michael J., "Embedded Linux: Using Compressed File Systems," downloaded from http://lwn.net/Articles/219827, Jan. 30, 2007, 7 pages.

Jian Ke, et al., "Runtime Compression of MPI Messages to Improve the Performance and Scalability of Parallel Applications," Supercomputing, 2004. Proceedings of the ACM/IEEE SC2004 Conference, Nov. 6-12, 2004, 7 pages.

Lekatsas/Yang et al., "CRAMES: compressed RAM for embedded systems," Hardware/Software Codesign and System Synthesis, 2005. CODES+ISSS '05. Third IEEE/ACM/IFIP International Conference on, Sep. 2005, pp. 93-98.

Mahapatra, N. et al. "The Performance Advantage of Applying Compression to the Memory System." ACM Workshop on Memory System Performance (MSP 2002), Jun. 2002, pp. 86-96.

Nitta, C. et al. "Techniques for Increasing Effective Data Bandwidth." IEEE International conference on Computer Design, Oct. 2008, pp. 514-519.

NVIDIA White Paper "NVIDIA's Next Generation CUDA Compute Architecture: Fermi," available at http://www.nvidia.com/content/PDF/fermi_white_papers/NVIDIA_Fermi_Compute_Architecture_Whitepaper.pdf</url>, 2009, 22 pages.

O'Reilly, "Reading and Writing Compressed Filed PHP Cookbook," downloaded from http://docstore.mik.ua/orelly/webprog/pcook/ch18_26.htm on Jan. 20, 2012, 2 pages.

Wegener, U.S. Appl. No. 13/358,511, filed Jan. 25, 2012, 49 pages.

Wegener, U.S. Appl. No. 13/616,898, filed Sep. 14, 2012, 83 pages.

Wegener, U.S. Appl. No. 13/617,061, filed Sep. 14, 2012, 78 pages.

Wolfe, M., and C. Toepfer. "The PGI accelerator programming model on NVIDIA GPUs." The Portland Group Insider (Jun. 2009), 27 pages.

PCT International Preliminary Report on Patentability for Application No. PCT/US2013/034443, Oct. 1, 2014, 8 sheets.

Int'l Search Report and Written Opinion mailed Jul. 1, 2013 in PCT/US13/34443 12 pp.

* cited by examiner

| Field Name | Bits | Notes |
|---|---|---|
| COMP_CMD | [15:8] | reserved |
| | [7:4] | COMP_INT_ENA[4] - enable interrupt upon completion of Descriptor D/C/B/A transaction. |
| | [3:0] | DMA Channel D/C/B/A (bits [3..3]) using DMA descriptor D/C/B/A. per channel: 0 = no cmd, 1 = compress |
| COMP_STATUS | [15:12] | DMA comp chan D: 0 = idle, 1 = busy |
| | [11:8] | DMA comp chan C: 0 = idle, 1 = busy |
| | [7:4] | DMA comp chan B: 0 = idle, 1 = busy |
| | [3:0] | DMA comp chan A: 0 = idle, 1 = busy |
| | | Values [2:15] for each DMA comp channel are reserved. |
| DECOMP_CMD | [15:8] | reserved |
| | [7:4] | DECOMP_INT_ENA[4] - enable interrupt upon completion of Descriptor D/C/B/A transaction. |
| | [3:0] | DMA Channel D/C/B/A (bits [3..0]) using DMA Descriptor D/C/B/A. per channel: 0 = no cmd, 1 = compress |
| DECOMP_STATUS | [15:12] | DMA decomp chan D: 0 = idle, 1 = busy, 2 = SYNC_ERR |
| | [11:8] | DMA decomp chan C: 0 = idle, 1 = busy, 2 = SYNC_ERR |
| | [7:4] | DMA decomp chan B: 0 = idle, 1 = busy, 2 = SYNC_ERR |
| | [3:0] | DMA decomp chan A: 0 = idle, 1 = busy, 2 = SYNC_ERR |
| | | Values [3:15] for each DMA DEcomp channel are reserved. |

Figure 13

| Field Name | Bits | Notes |
|---|---|---|
| SOURCE | [63 or 31:0] | Start address of the source (uncompressed) buffer. Transactions advance the initial SOURCE address by N_PKTS*PKT_LENGTH |
| DEST | [63 or 31:0] | Start address of destination (compressed) buffer. Transactions advance initial DEST pointer by the number of 32-bit words written to the compressed array: C_LENGTH(comp) = 1 + DEST (end) - DEST (start) |
| N_PKTS | [15:0] | Number of packets to compress or copy, 1 to 65535 (unsigned 16-bit int) |
| PKT_LENGTH | [15:0] | Number of samples per packet (unsigned int from 32 to 65536) -1 (typically a multiple of 6 or a power of 2) |
| D_TYPE | [15:13] | DATATYPE: 0: uint, 1: int, 2: float, 3: RGB, 4: YUV, 5: Bayer 6 - 8: reserved |
|  | [12:10] | BITS_PER_SAMP: 0: 8, 1: 10, 2: 12, 3: 14, 4: 16, 5: 32, 6: 64, 7: reserved |
|  | [9:6] | Color Image Format Format 0 - 8: Format 9 - 15: reserved YUV Color Space Decimation |
|  | [5:4] | 0: none, 1: 4:4:4 → 4:2:2, 2: 4:4:4 → 4:2:0 Color Space Conversion: 0 = OFF, 1 = RGB → YUV, |
|  | [3:2] | 2 = RGB → YCrCb (studio), 3 = RGB → YCrCb |
|  | [1:0] | Bits [1:0] are reserved (computer) |
| VERSION | [15:0] | Version number |
| RR_CONFIG | [15:13] | RR_STRIDE2: 1, 2, 3, 4, 6 |
|  | [12:10] | RR_MANUAL_STRIDE: 1, 2, 3, 4, 6 |
|  | [9] | RR_MANUAL_ADD_SUB: 0 = subtract, 1 = add |
|  | [8:7] | RR_MANUAL_DERIV: 0, 1, 2 (samps, dif1, dif2) |
|  | [6:3] | Bits [6:3] are reserved |
|  | [2:0] | RR_AUTO_MANUAL (0 = AUTO, 1 = MANUAL) Bit 2: STRIDE1  Bit 1: ADD_SUB  Bit3: DERIV |
| MODE | [15:12] | C_MODE: 0: copy only  1: lossless  2: average rate 3: constant rate  4: fixed quality (increments of 0.5 db) Floating-Point modes only: 5: FP2 fixed rate, 6: FP2 ABS error, 7: FP2 REL error 8: FP4 fixed rate, 9: FP4 ABS error, 10: FP4 REL error Bits [11:14] |
|  | [11:0] | C_PARAM (10, 11, or 12 bits): Avg & Const Rate:     #dwords per packet*in[11:0] Fixed Quality (dB):     ATTEN (6.4 format; [9:0]) FP2 & FP4 ABS error:    EXP_THRESH (floats; [10:0]) FP2 & FP4 REL error:    % error (0.1% to 99.9%; [9:0]) |
| H_DIM | [15:0] | Number of samples or color components per 2D row |
| V_DIM | [15:0] | Number of rasters per 2D frame or rows per 2D matrix |

Figure 14

| Field Name | Bits | Notes |
|---|---|---|
| SOURCE | [63:0] RD/WR or [31:0] RD/WR | Start address of the source (compressed) buffer. Transactions advance the initial SOURCE pointer by the number of 32-bit words read from the compressed array: C_LENGTH(decomp) = SOURCE(end) - SOURCE(start) |
| DEST | [63:0] RD/WR or [31:0] RD/WR | Start address of destination (uncompressed) buffer. Transactions advance initial DEST address by N_PACKETS*PKT_LENGTH, assuming no SYNC errors. |
| N_PACKETS | [15:0] RD/WR | Number of packets to decompress or to copy, 1 to 65535 (unsigned 16-bit int) |
| PKT_LENGTH | [15:0] RD/WR | Packet length (unsigned int from 32 to 65536) - 1 (typically a multiple of 6 or a power of 2) |
| D_TYPE | [15:13] [12:10] [9:6] RD/WR [5:4] [3:2] [1:0] | DATATYPE: 0:uint  1:int  2:float  3:RGB  4:YUV  5:Bayer  6 - 8: reserved<br>BITS_PER_SAMP:<br>0: 8  1: 16  2: 32  3: 64<br>Color Image Format<br>    Format  0 - 8:<br>    Format  9 - 15: reserved<br>YUV Color Space Decimation<br>    0: none  1:  4:4:4: → 4:2:2   2:  4:4:4: → 4:2:0<br>RGB  YUV conversion (0 = off, 1 = on)<br>Bits [3:0] are reserved |
| VERSION | [15:0] | Version Number |

Figure 15

| Packet Header Bits | Field Name | Field Value | Notes |
|---|---|---|---|
| PKT_HDR[11:0] | SYNC | 0x97F | SYNC word: [11:8] = 0x9  [7:4] = 0x7  {4:0] = 0xF |
| PKT_HDR[21:12] | ATTEN | 10-bit 6.4 format | 6 integer bits (0 ...64-bit shift)  [21:16] 4 fractional bits  [15:12] 6 db/16 = 0.375 per fractional bit |
| PKT_HDR[24:22] | STRIDE1* | 1,2,3,4,6,N | Redundancy Remover Stride: 0 → 1, 1 → 2, 2 → 3, 3 → 4, 4 → 5, 5 → RR_N_FIFO, 6 - 7 reserved |
| PKT_HDR[25] | ADD_SUB | 0 or 1 | Redundancy Remover add/sub control: 0 = subtract  1 = add |
| PKT_HDR[27:26] | DERIV | 0, 1, or 2 | Redundancy Remover deriv (0, 1, 2) 3: reserved |
| PKT_HDR[29:28] | INT_OR_FLOAT | 0, 1, or 2 | 0: int, 1: 32-bit float, 2: 64-bit float If INT_OR_FLOAT > 0, MAX_EXP is included in each packet header. |
| PKE_HDR[30] | PKT1_IN_FRAME | 0 or 1 | When DTYPE = RGB, YUV, Bayer or other 2-dim data, PKT1_IN_FRAME is set (=1) when the packet is the first in a 2D frame. |
| PKT_HDR[31] | CRC32_FLAG | 0 or 1 | 32-bit CRC sent after each payload (0 = no CRC32, 1 = CRC32 present) |
| PKT_HDR[47:32] | MAX_EXP (optional) | (only for floats) | 8-bit or 11-bit maximum floating point exponent (stored in a 16-bit int) |
| Payload | ... | ... | ... |
| PKT_CRC [31:0] | CRC32 (optional) | | CRC32 checksum per packet, includes all 32-bit compressed words from SYNC pattern to last 32 bits of compressed payload. |

Figure 16

DATA COMPRESSION FOR DIRECT MEMORY ACCESS TRANSFERS

RELATED APPLICATIONS

This application claims benefit of U.S. Provisional Patent Application No. 61/618,534 filed on 30 Mar. 2012, entitled DATA COMPRESSION FOR DIRECT MEMORY ACCESS TRANSFERS.

This application is related to U.S. Patent Application No. 61/618,463, filed on 30 Mar. 2012, entitled PROCESSING SYSTEM AND METHOD INCLUDING DATA COMPRESSION API, and is also related to U.S. Patent Application No. 61/618,509, filed on 30 Mar. 2012, entitled CONVERSION AND COMPRESSION OF FLOATING POINT AND INTEGER DATA, all of which are incorporated by reference.

BACKGROUND

1. Field of Invention

The present invention relates to computer system operation, including data transfer operations among the elements of a memory system that include data compression and decompression.

2. Description of Related Art

In some computer systems, including multicore processors systems and graphical processor systems, memory is organized hierarchically. The memory hierarchy can include a relatively small first level (L1) cache memory and a larger second level (L2) cache memory on the same integrated circuit as the processor core circuitry, along with off-chip, large scale memory implemented often using dynamic random access memory. In some configurations, a third level (L3) cache can be included on-chip. Other memory can be used for sharing data among processor cores, such as shared cache memory and message-passing memory. Additional memory in the hierarchy can include persistent stores, such as flash memory, magnetic disk drive memory, network-attached storage and so on. Given the variety of memory technologies, the organization of memory systems is very diverse.

As processor performance has improved, processors are executing programs over larger and larger data sets. Also, one processor or group of processors may concurrently execute many programs, each of which requires access to different sizes and types of data sets. For example, broad varieties of application programs acquire, collect, process, and display numerical data. Numerical data includes a variety of data types, such as integers, floating-point numbers, image data, video data, and graphics objects. Numerical data can be accumulated in large files, or acquired at high speeds, and movement of such data among elements of processor system memory hierarchies can cause bottlenecks in system performance.

Thus, the amount of memory available, in terms of the number of bytes, at each element of a memory system for a given computer system, and the bandwidth of the data channels among the elements of the memory system, can limit the efficiency and speed with which a given program can be executed. Given the variant computer systems architectures and variant memory system configurations, the control of data flow among the memory elements is often implemented in a platform-specific manner. This platform-specific memory management interferes with users' ability to individually manage data flow to improve the efficiency of the utilization of memory resources in a give computer system.

It is desirable to provide technologies that can be employed to improve efficiency of memory system operations in computer systems.

Commonly owned patents and applications describe a variety of compression techniques applicable to fixed-point, or integer, representations of numerical data or signal samples. These include U.S. Pat. No. 5,839,100 (the '100 patent), entitled "Lossless and loss-limited Compression of Sampled Data Signals" by Wegener, issued Nov. 17, 1998, and the U.S. patent application Ser. No. 12/605,245 (the '245 application), entitled "Block Floating Point Compression of Signal Data," publication number 2011-0099295, published Apr. 28, 2011. The commonly owned patent application Ser. No. 12/891,312 (the '312 application), entitled "Enhanced Multi-processor Waveform Data Exchange Using Compression and Decompression," by Wegener, publication number 2011-0078222, published Mar. 31, 2011, incorporated herein by reference, describes configurable compression and decompression for fixed-point or floating-point data types in computing systems having multi-core processors. In a multi-core processing environment, input, intermediate, and output waveform data are often exchanged among cores and between cores and memory devices. The '312 application describes a configurable compressor/decompressor at each core that can compress/decompress integer or floating-point waveform data. The '312 application describes configurable compression/decompression at the memory controller to compress/decompress integer or floating-point waveform data for transfer to/from off-chip memory in compressed packets. The commonly owned non-provisional patent application Ser. No. 13/534,330 (the '330 application), filed Jun. 27, 2012, entitled "Computationally Efficient Compression of Floating-Point Data," incorporated herein by reference, describes several embodiments for compression floating-point data by processing the exponent values and the mantissa values of the floating-point format. The commonly owned non-provisional patent application Ser. No. 13/358,511 (the '511 application), filed Jan. 25, 2012, entitled "Raw Format Image Data Processing," incorporated herein by reference, describes compression of raw format image data at least as fast as the image data rate.

In order to better meet the requirements of higher speed data transfer, reduced memory utilization and minimal computation in many computing applications, a need exists for computationally efficient compression and decompression in a DMA controller and corresponding DMA descriptors.

SUMMARY

Memory system operations are extended for a data processor by a DMA controller, including a set of operations, and an associated DMA descriptor, including a set of parameters for the operations, which provide for data compression and decompression during or in conjunction with processes for moving data between memory elements of the memory system. The set of operations can be implemented in the data processor using software-implemented functions, which can be hardware-assisted, configured to use the parameters and perform the operations of the DMA controller. The DMA controller can support moves between memory having a first access latency, such as memory integrated on the same chip as a processor core, and memory having a second access latency that is longer than the first access latency, such as memory on a different integrated circuit than the one on which the processor core is, or cores are, located. In such data move operations, any added latency associated with the compression or decompression can be absorbed with less impact on access by the processor core to mission critical data.

Parameters of the DMA descriptor can include indicators of data type, size of a sample set, and compressed packet location (destination for a compression operation, source for a decompression operation), uncompressed packet location (destination for a decompression operation, source for a compression operation), and a selected compression mode, such as lossless, fixed rate, or fixed quality modes. The term "uncompressed" is used herein can refer to data which can be provided as input to a compression engine, or as data output from a decompression engine, including never-compressed data or previously compressed and then decompressed data. A set of different algorithms that may be applied for compression and decompression operations by the DMA controller can be specified by parameters included in the DMA descriptor for a particular data move. The set of different algorithms can include algorithms specialized for data types identified in the parameters of the DMA descriptor, including for example algorithms for compression of floating point numbers, algorithms for compression of integers, algorithms for compression of image data, and so on. Also, the set of different algorithms can include algorithms specialized for compression qualities as identified in the parameters of the DMA descriptor, such as lossless compression, lossy compression of different types, compression to achieve specified compression ratios, algorithms that maintain specified limits on compression quality in terms of loss of data, and so on.

A data processor is described that includes a DMA controller and associated DMA descriptors which provides for compression and decompression during processes that move data between memory elements of a memory system deployed in, or otherwise accessible by, the data processor. The data processor can initiate compression or decompression procedures that utilize a DMA descriptor and the associated parameters needed for the respective procedure.

BRIEF DESCRIPTION OF THE DRAWINGS

FIG. 13 illustrates compression and decompression command (CMD) and status (STATUS) registers according to one embodiment.

FIG. 14 illustrates the compression DMA descriptor according to one embodiment.

FIG. 15 illustrates the decompression DMA descriptor according to one embodiment.

FIG. 16 illustrates the contents of a compressed packet header according to one embodiment.

DETAILED DESCRIPTION

Figure 1:
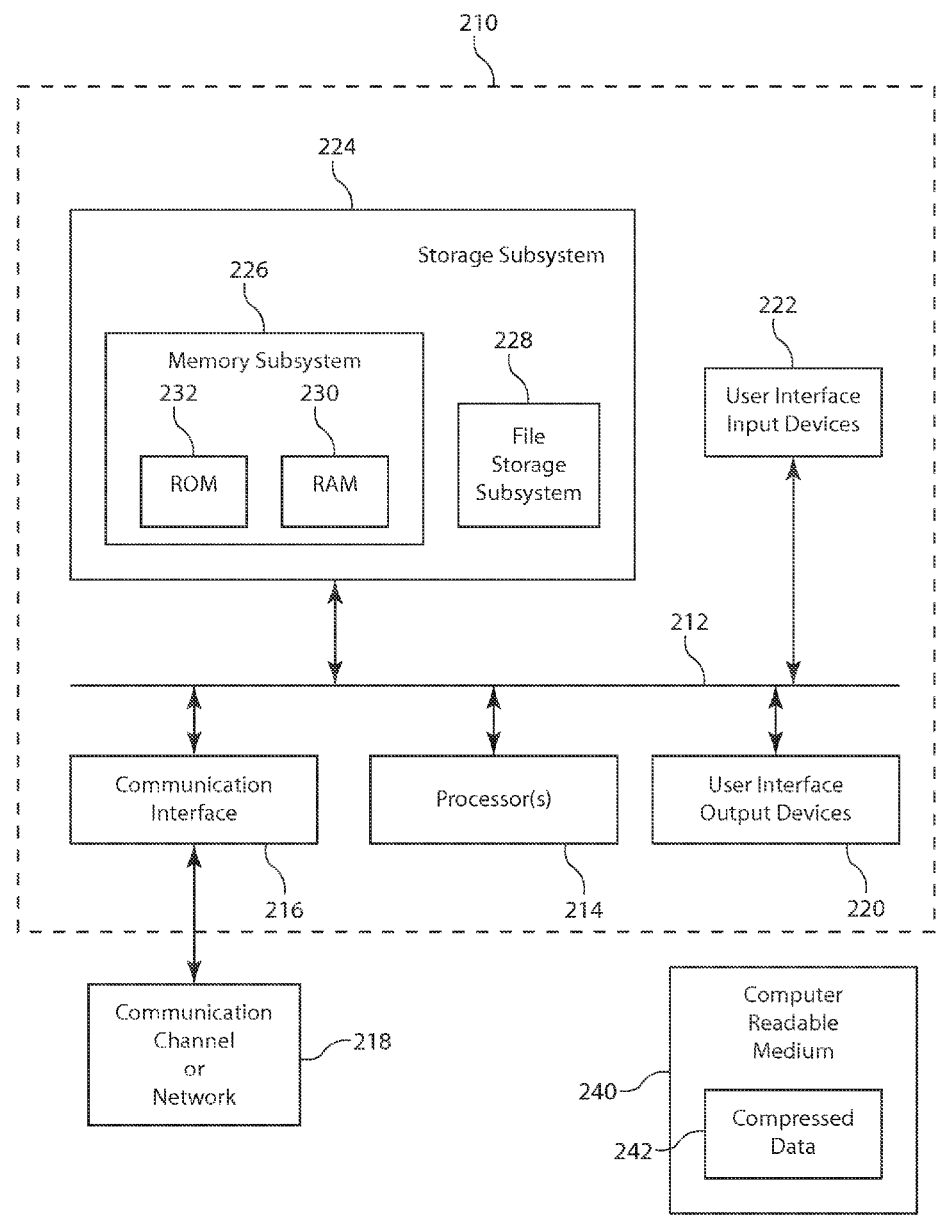
FIG. 1 is a block diagram of a computer system suitable for use with embodiments of the compression and decompression numerical data.

A DMA controller incorporating compression and decompression technology accelerates a broad variety of software and hardware applications that acquire, collect, process, store, and display numerical data. Examples of numerical data include integers, floating-point numbers, imaging, video, and graphics objects. The compressor accepts integer samples (including integers representing pixels from images and video frames) and floating-point samples and compresses them in lossless, fixed rate, and fixed quality modes. The decompressor decompresses a stream of compressed packets and regenerates an exact copy (for lossless compression), or an approximation (for lossy compression) of, the original integer or floating-point samples. In addition to the compression mode and input data type, users can control the packet size (number of samples per compressed packet) and fixed-rate adaptation speed. The compression supports different data types, including signed 8-bit, 16-bit, and 32-bit integer data, and 32-bit and 64-bit floating-point data or a proprietary data type that may be used in the computing system. The 32 and 64 bit data types may be compatible with the IEEE-754 Standard for Floating-Point Arithmetic, referred to as "IEEE-754 standard". Compression operations are configurable to support different data structures, including image data structures such as RGB, YUV, and Bayer matrix, as described in the '511 application. Compression modes may include lossless mode, constant compressed bit rate mode, average rate mode, and fixed quality mode. Additional types of compression algorithms may be applied to floating-point samples. Alternatives for floating-point compression may include operating on floating-point samples or converting floating-point samples to integer samples prior to compression.

The compression and decompression technology can be implemented in hardware, software or a combination of both, and incorporated in computing systems, such as those described above. The hardware implementations include application-specific integrated circuits (ASIC), field-programmable gate array (FPGA) or an intellectual property (IP) block for systems-on-chip (SoCs). The compression and decompression operations can be implemented in software or firmware on a programmable processor, such as a digital signal processor (DSP), microprocessor, microcontroller, multi-core central processing unit (CPU), or graphics processing unit (GPU). Hardware-compressed streams can be decompressed by software, and software-encoded streams can be decompressed by hardware.

Data transfer interfaces in a computer system or network of computer systems may generally include interfaces connecting processing units, memories (including off-chip memory), external storage devices and data acquisition devices. The architectures described below give examples of data transfer interfaces in a computer system or network of computer systems. Data compression speeds the data rate by reducing the number of bits per sample to be transferred across the data transfer interfaces. Faster data transfer improves the system performance because it reduces the time that processors wait for data.

FIG. 1 is a block diagram of a representative computer system suitable for use embodiments of compression and decompression. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a communication interface subsystem 216. The input and output devices allow user interaction with computer system 210. Communication interface subsystem 216 provides an interface to communication channel or network 218, which may be a single channel or a communication network having multiple channels. The communication channel or network 218 is coupled to corresponding interface devices in other computer systems, transmitting or receiving devices, or an outside network (not shown). The communication channel or network 218 may comprise wireline links, optical links, wireless links, or any other mechanisms for communication of information. The communication network 218 may comprise many interconnected computer systems and communication links. While in one embodiment, communication network 218 is the Internet, in other embodiments, the communication network 218 may be any suitable computer network.

User interface input devices 222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 210.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display, such as via audio output devices. In general, use of the term "output device" is intended to include all possible types of devices and ways to output information from computer system 210 to the user or to another machine or computer system.

Storage subsystem 224 stores the basic programming and data constructs that may provide some or all of the functions for the compression and/or the decompression described herein. These software modules are generally executed by processor 214. The processor(s) 214 may include one or more of a DSP, microprocessor, microcontroller, CPU or GPU, or a combination of these devices. The processor(s) 214 may also include dedicated application specific integrated circuit (ASIC) or field-programmable gate array (FPGA) logic implementing some or all of the compression and/or decompression functionality.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges, including Universal Serial Bus (USB) thumb drives with USB interface and flash media storage. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer readable medium 240 can be a medium associated with file storage subsystem 228, and/or with communication interface subsystem 216. The computer readable medium 240 can be a hard disk, a floppy disk, a CD-ROM, an optical medium, removable media cartridge, USB thumb drive, flash media storage, or electromagnetic wave. The computer readable medium 240 is shown storing a compressed data file 242. The computer readable medium may also store programs implementing the functions of compression and/or decompression.

Computer system 210 itself can be of varying types including a personal computer, a portable computer, a workstation, a computer terminal, a network computer, a mainframe, a television, a smart phone, a tablet computer or any other data processing system or user device. Due to the ever-changing nature of computers and networks, the description of computer system 210 depicted in FIG. 1 is intended only as a specific example for purposes of illustrating the preferred embodiments. Many other configurations of computer system 210 are possible having more or fewer components than the computer system depicted in FIG. 1.

Several examples follow of multiple processor core devices suitable for embodiments of compression and decompression. For example, a multiple processor core device may comprise the processor(s) 214 of the computer system 210 of FIG. 1. For another example, a multiple core processor may be embedded in an application device, such as a mobile handset, smartphone, set-top box, medical imaging device, wireless communication infrastructure, or other compute-intensive instruments. In the '312 patent application, incorporation of compression and decompression resources in a variety of computer system architectures is described. The following are examples of those and other systems.

Figure 2:
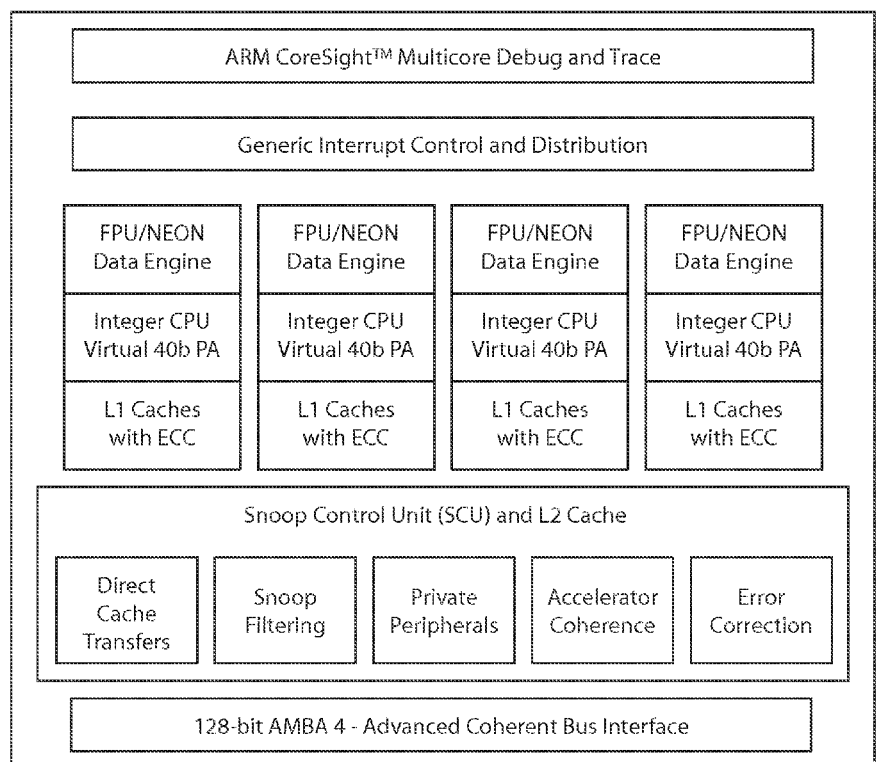
FIG. 2 illustrates a block diagram of a four-core Advance RISC Machines (ARM) Cortex-A15 processor.

FIG. 2 illustrates a block diagram of a four-core Advance RISC Machines (ARM) Cortex-A15 processor. The A15 core, which ARM introduced in September 2010, is targeted for use in smart phones (one to two A15 cores), wireless base stations (two to four cores), and low-power servers (four to twelve cores). In FIG. 2, the four A15 cores share a Level 2 (L2) cache and connections to the 128-bit AMBA 4 bus. The AMBA 4 bus can connect at least 3 four-core A15 processors, thus allowing A15 users to instantiate as many as twelve A15 cores on a single silicon die. The ARM Cortex-A15 design will typically be fabricated in 32 nm or 28 nm CMOS processes. In FIG. 2, the block labeled "FPU/NEON Data Engine" (FPU=Floating Point Unit; NEON=ARM's Single Instruction, Multiple Data [SIMD] execution unit) could also incorporate compression and decompression functions. The Snoop Control Unit (SCU) is an interface for the AMBA 4 bus. The SCU could include an additional block implementing compression and decompression functions. Integer and floating-point data types are sent to, and received from, other A15 cores and from off-chip memories and busses, via the AMBA 4 bus interface. Data compression would add significant additional bandwidth to the on-chip AMBA 4 bus, or alternately, would allow AMBA 4 transfers to require significantly less power when compared to existing uncompressed transfers of floating-point and integer numbers.

Figure 3:
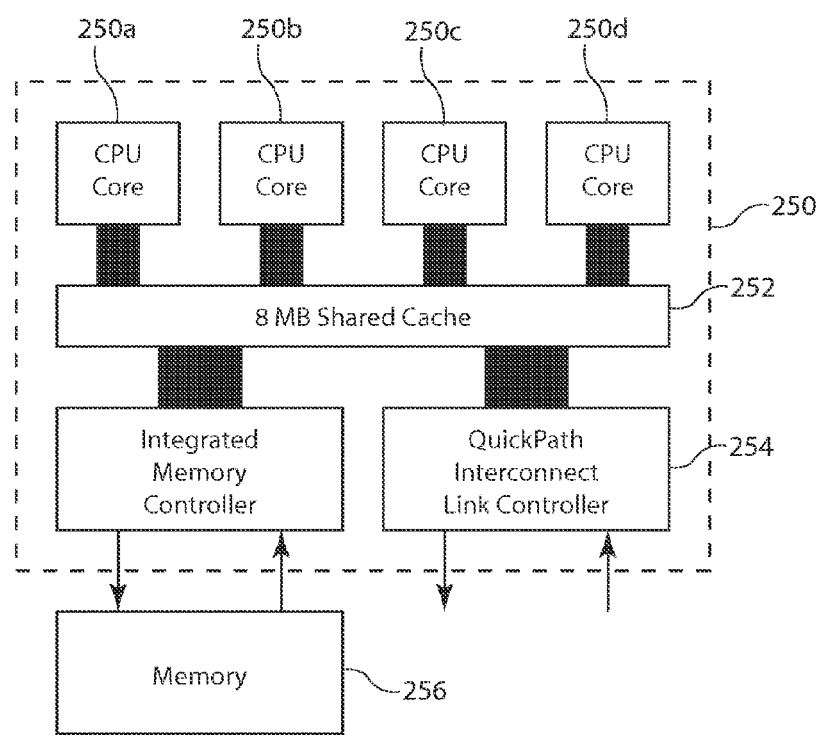
FIG. 3 illustrates the Intel Nehalem CPU architecture.

FIG. 3 illustrates the Intel Nehalem CPU architecture. The Intel Nehalem CPU 250 contains four processor cores 250a, 250b, 250c, and 250d on one die, with a shared cache 252 having a capacity of 8 MB. The processor cores 250a through 250d access other computer system peripherals through a pair of Quick Path Interconnect (QPI) interfaces 254. The QPI interfaces 254 use a packet-based communication protocol. Some versions of Intel CPUs also use one or more QPI interfaces 254 to communicate with other Intel CPUs on other sockets also having one or more QPI interfaces 254. Compressed numerical data may be transferred among CPU cores 250a-d, cache 252, memory 256, and QPI interfaces 254. A compressor can be integrated at each QPI interface 254, such as by integration into the QPI interface's associated link controller(s), to compress data for the payloads of the QPI packets to be transmitted and to decompress the compressed data from the payloads of the received QPI packets. An off-chip input controller (not shown) for providing data for the Nehalem processor may compress the data to form compressed payload data for the QPI packets. A decompressor at the QPI interconnect link controller 254 decompresses the compressed payload data and provides the decompressed data as payload data for QPI packets for transfer to the CPU cores 250a-d. The CPU cores 250a-d may also implement a compressor and decompressor for data transfers. The integrated memory controller may also include a compressor and a decompressor to compress waveform data provided to off-chip memory and to decompress compressed waveform data retrieved from memory. Alternately, the CPU may also include enhanced instructions to accelerate some or all of the compression and/or decompression functions.

Figure 4:
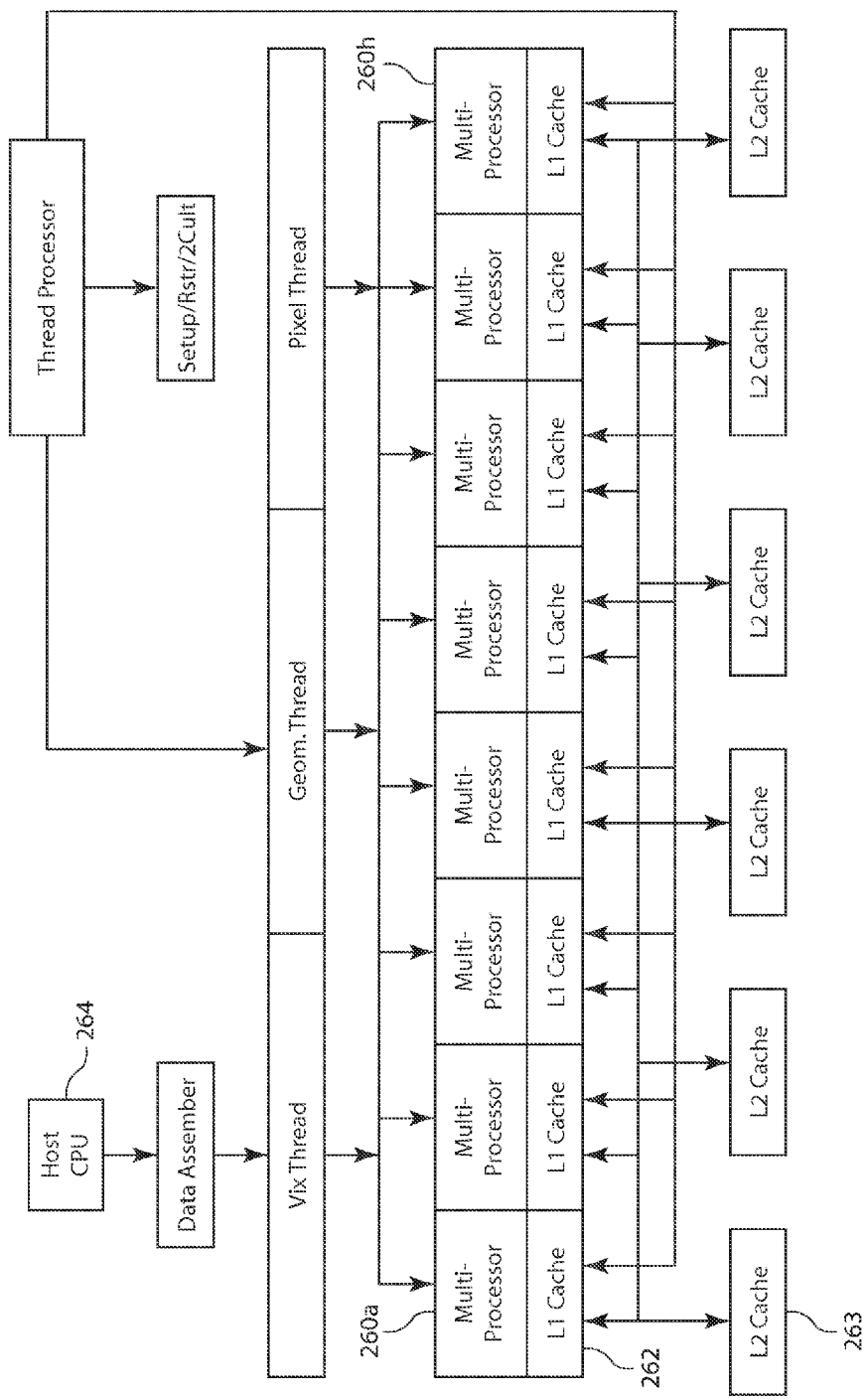
FIG. 4 illustrates the Nvidia GeForce 8800 GPU architecture.

FIG. 4 illustrates the Nvidia GeForce 8800 GPU architecture. The Nvidia GeForce 8800 GPU includes 64 processors grouped into 8 multi-processors 260a through 260h. Each multi-processor includes 8 cores. The multi-processors 260a through 260h utilize distributed Level 1 (L1) cache 262 and distributed Level 2 (L2) cache 263 to store input values, intermediate results, and output values, and to exchange such values between cores. The GeForce 8800 receives input data values and transmits output data values from and to a host CPU 264. For example, compression may be integrated into the host-to-GPU and GPU-to-host communications controller for the data assembler. Compression and decompression may also be integrated into a GPU memory controller (not shown in FIG. 4).

Figure 5:
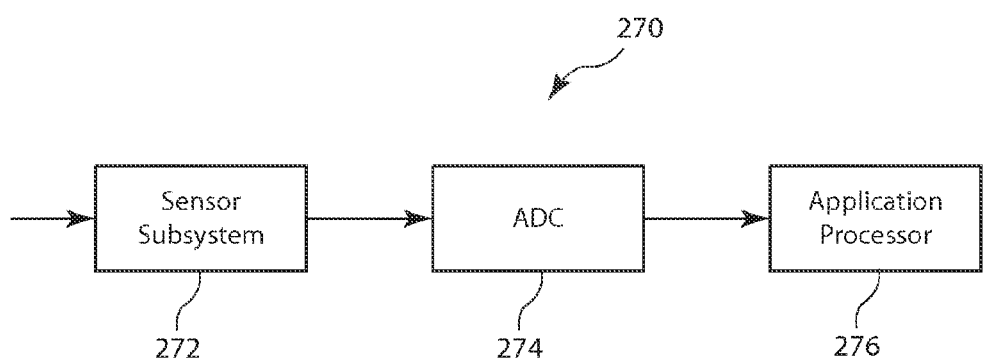
FIG. 5 is a block diagram of a sensor processing system.

FIG. 5 is a block diagram of a sensor processing system 270. A sensor subsystem 272 detects a physical signal of a particular modality and provides an analog signal representing the physical measurement to the analog-to-digital converter ADC 274. Examples for the sensor subsystem 272 include an acoustic transducer, an x-ray detector, a radio antenna, a seismic sensor, or an array of sensors. The ADC 274 converts the analog signal to digital signal samples provided to the application processor 276. The application processor may have a custom computing architecture for processing the signal samples or an architecture as depicted in FIGS. 1 to 4. The application processor 276 may compress the signal samples for a number of purposes, including storage in an internal memory or external storage device, transfer among processing units within the processor 276 or transfer to an external device for further processing, storage, display, etc.

Figure 6:
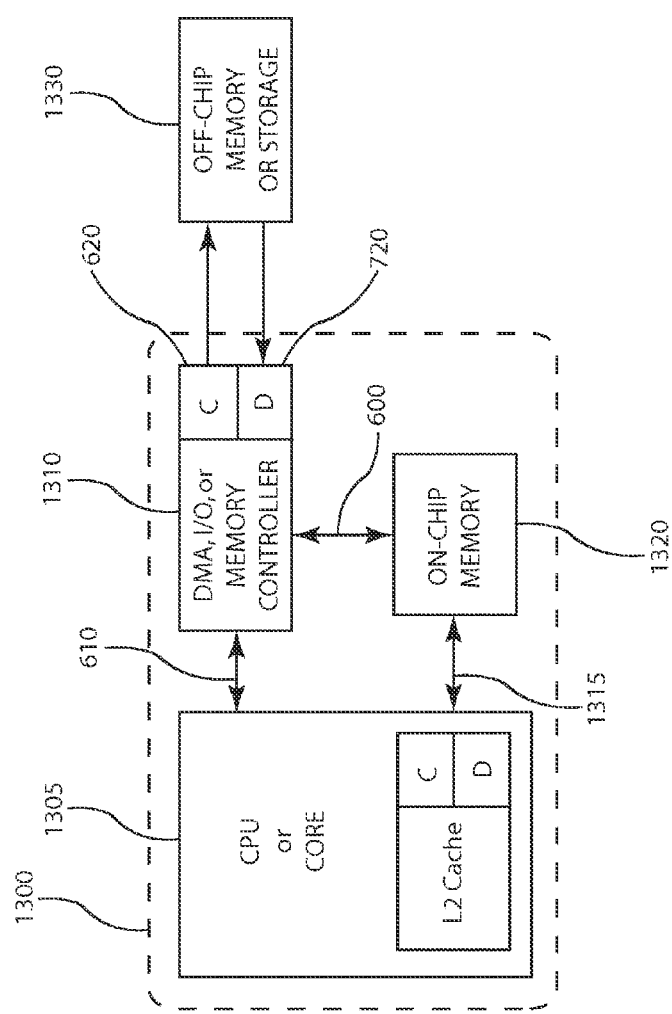
FIG. 6 illustrates an enhanced DMA, input-output, or memory controller using compression and decompression for off-chip memory access.

FIG. 6 illustrates a processor 1300 whose read and write access to an off-chip memory or storage device 1330 is improved using compression and decompression. CPU or core 1305 accesses both on-chip memory 1320 and off-chip memory or storage device 1330. CPU or core 1305 accesses to on-chip memory 1320 are performed directly via address and data bus 1315. CPU or core 1305 requests compressed accesses (reads or writes) to off-chip memory or storage 1330 via direct memory access (DMA), input-output, or memory controller 1310, via control interface 610. Control interface 610 allows CPU or core 1305 to provide control parameters for the configurable compressor 620 to compress integer or floating-point data, to compress in a lossless or lossy mode, to specify desired compressed block size, and other compression-specific parameters during data writes to off-chip memory or storage device 1330. The configurable compressor 620 may include the control information in the headers of compressed packets stored in off-chip memory or storage device 1330. During data reads from off-chip memory or storage device 1330, the configurable decompressor 720 decodes control information in each compressed packet header decompresses integer or floating-point values using decompression operations in accordance with the control parameters. The decompressed output samples are output to on-chip memory 1320. The configurable compressor 620 is especially suitable for the block or packet-based nature of accesses to off-chip memory or storage 1330. When element 1310 is implemented as a DMA controller, large blocks of data are typically transferred between on-chip memory 1320 and off-chip memory or storage device 1330. Because the compression and decompression described herein is applicable to packet-based or stream processing (in contrast to single-value processing), the configurable compressor 620 and the configurable decompressor 720 are well-suited to DMA accesses. Also, since CPU or core 1305 typically initiates DMA accesses via DMA controller 1310, the latency introduced by the configurable compressor 620 during data writes, or by the configurable decompressor 720 during data reads from the off-chip memory or storage device 1330, can be hidden in the relatively long DMA transaction times. DMA transaction time is long when compared to CPU 1305's access to on-chip memory 1320.

Figure 7:
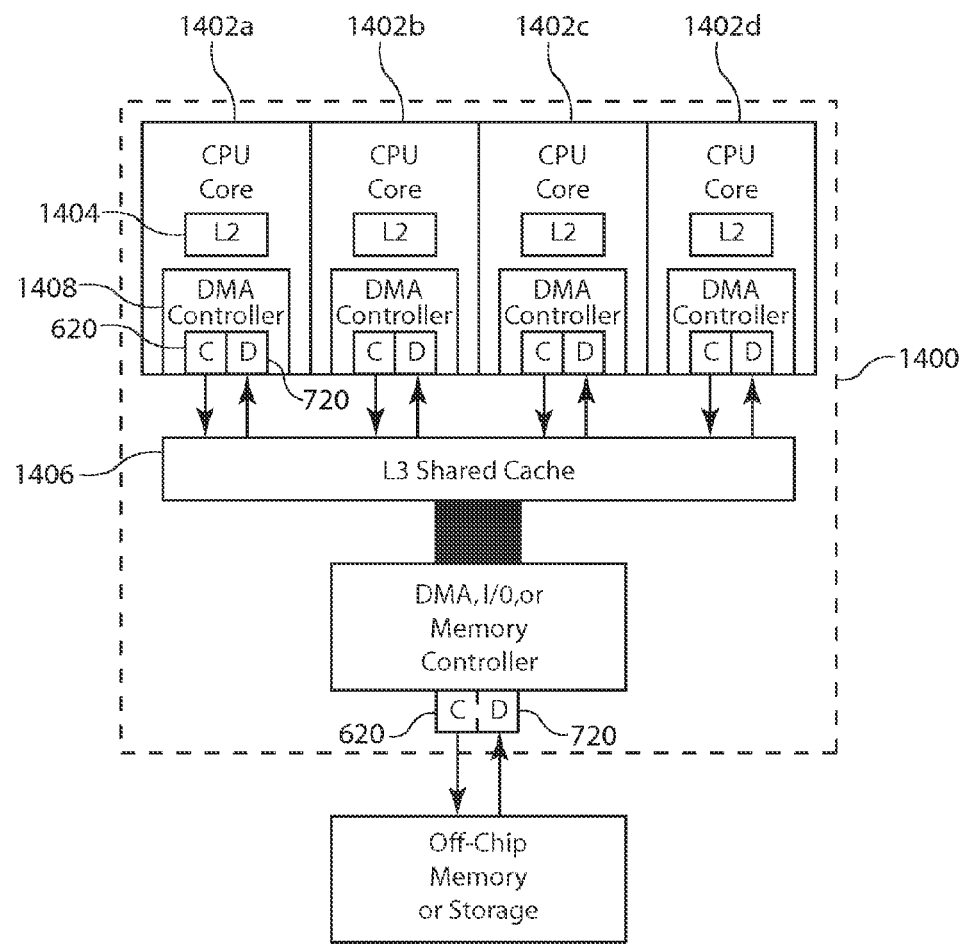
FIG. 7 illustrates an example integration of a configurable compressor and decompressor for on-chip memory access.

FIG. 7 illustrates a processor 1400 whose read and write accesses between a higher level cache 1404 and a lower level shared cache 1406 are improved using compression and decompression. Core 1402 accesses both higher level cache 1404 and a lower level shared cache 1406. Core 1402 requests compressed accesses (reads or writes) to the lower level cache 1406 via cache controller 1408. Cache controller 1408 is comprised of a configurable compressor 620 and a configurable decompressor 720. Core 1402 provides control parameters for the configurable compressor to compress integer or floating-point data, to compress in a lossless or lossy mode, to specify desired compressed block size, and other compression-specific parameters during data writes to lower level cache 1406. The configurable compressor 620 may include the control information in the headers of compressed packets stored in lower level cache 1406. During data reads from lower level cache 1406, the configurable decompressor 720 decodes control information from each compressed packet header and decompresses integer or floating-point values using decompression operations in accordance with the control parameters. The decompressed output samples are output to higher level cache 1404. Likewise, for transfers to/from off-chip memory or storage, the DMA, I/O or memory controller may include a configurable compressor 620 and a configurable decompressor 720.

Figure 8:
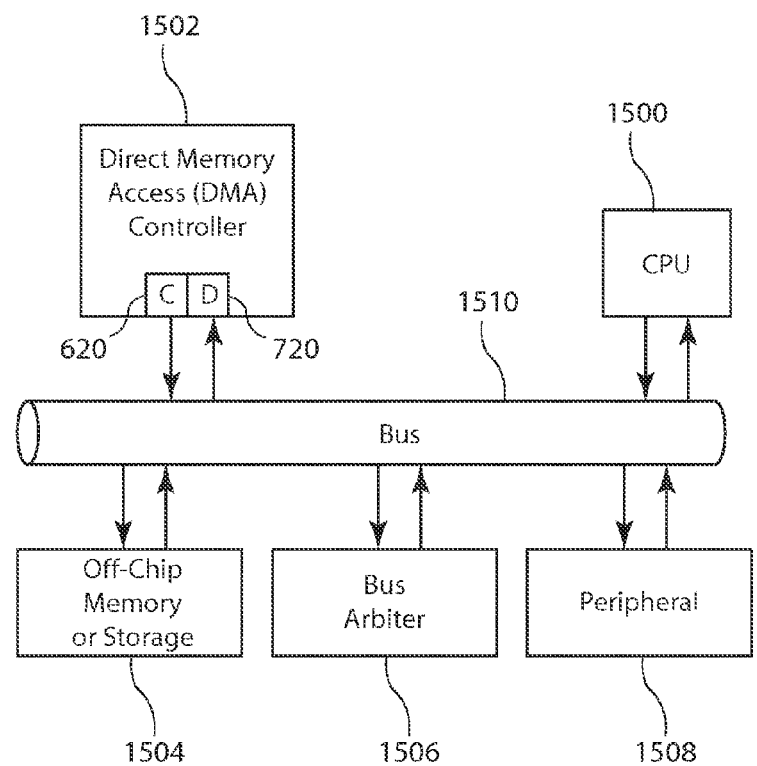
FIG. 8 illustrates an example system wherein multiple peripheral devices share a common bus with one device being a DMA controller which includes a configurable compressor and decompressor for off-chip memory access.

FIG. 8 illustrates an example system wherein multiple peripheral devices share a common bus with one device being a DMA controller 1502 which includes a configurable compressor 620 and decompressor 720 for off-chip memory access. CPU 1500 accesses both on-chip memory and off-chip memory or storage device 1504. CPU 1500 requests compressed accesses (reads or writes) to off-chip memory or storage 1504 via DMA, input-output, or memory controller 1502, via bus 1510. The bus 1510 allows CPU 1500 to provide control parameters for the configurable compressor 620 to compress integer or floating-point data, to compress in a lossless or lossy mode, to specify desired compressed block size, and other compression-specific parameters during data writes to off-chip memory or storage device 1504. The configurable compressor 620 may include the control information in the headers of compressed packets stored in off-chip memory or storage device 1504. During data reads from off-chip memory or storage device 1504, the configurable decompressor 720 decodes control information in each compressed packet header decompresses integer or floating-point values using decompression operations in accordance with the control parameters. The decompressed output samples are output to on-chip memory.

Figure 9:
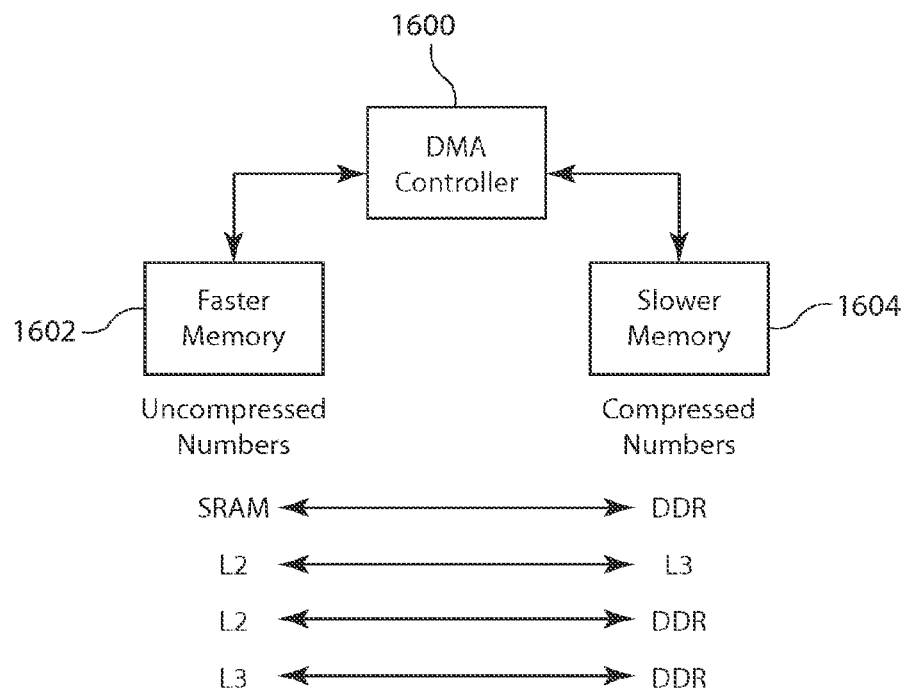
FIG. 9 illustrates various combinations of fast memory containing uncompressed data sets and slow memory containing compressed data sets.

FIG. 9 illustrates various combinations of fast memory containing uncompressed data sets and slow memory containing compressed data sets. DMA controller 1600 transfers data between a faster memory 1602 and a slower memory 1604. The faster memory 1602 and the slower memory 1604 are examples of memory elements or memory modules accessed by the DMA controller 1600. Data in the faster memory comprises uncompressed data while the data in the slower memory is stored as compressed data. Examples of paired memory included on-chip SRAM (faster) and off-chip DDR (slower), on-chip L2 cache (faster) and on-chip L3 cache (slower), on-chip L2 cache (faster) and off-chip DDR (slower), and on-chip L3 cache (faster) and off-chip DDR (slower) memory. Essentially any transfer between two memories wherein one is faster than the second memory a DMA controller containing a configurable compressor and decompressor will enhance data transfer between the memories. Compressing the data stored in the slower memory increases its storage capacity, but more importantly the rate of transfer from the slower memory is greatly enhanced.

Figure 10:
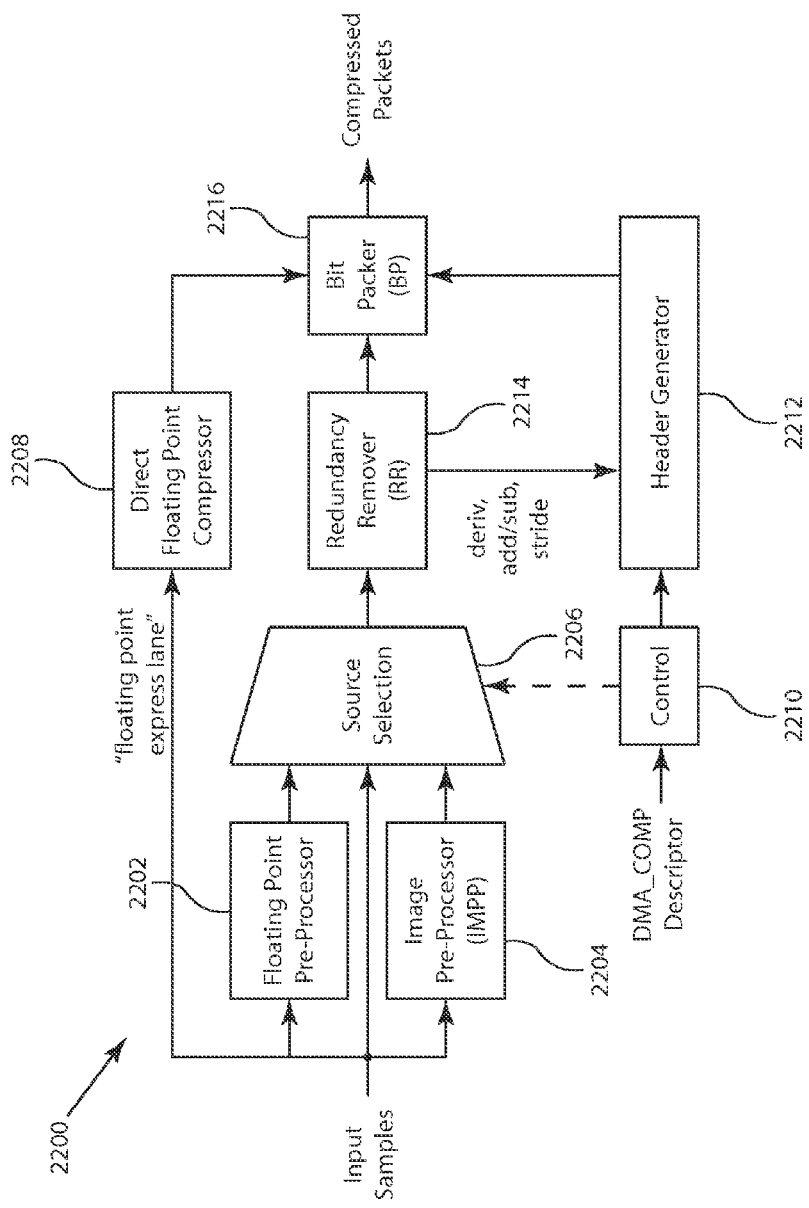
FIG. 10 illustrates a DMA compressor block diagram according to one embodiment.

FIG. 10 illustrates the compressor portion of the DMA controller according to a preferred embodiment. The compressor 2200 comprises the following blocks:
pre-processor blocks for:
  Floating Point Pre-processor 2202 to convert data types between 32-bit and 64-bit floating-point samples and 32-bit integer samples,
  Image Pre-Processor 2204, for RGB, YUV, and Bayer matrix image data
Redundancy Remover (RR) 2214
Bit packer (BP) 2216
Header Generator 2212
Direct Floating Point Compressor 2208 (lossy only & low latency)
Controller 2210

For example, when the user selects lossless floating point mode, the floating point pre-processor 2202 converts floating-point samples to integer samples. Preferably, both 32-bit single-precision floats and 64-bit double-precision floating point samples may be converted to 32-bit integer samples. The source selector 2206 selects the integer samples for compression by the redundancy remover 2214, based on control parameters received from the controller 2210.

The direct floating-point compressor 2208 provides direct compression of the floating-point samples, without first converting the floating-point samples to integer samples. The direct floating-point compressor 2208 produces lower latency than conversion followed by integer compression. The '330 application describes several alternative compression modes for direct floating-point compression that may be implemented by the direct floating-point compressor 2208. Two of these compression modes, referred to herein as FP2 and FP4, apply thresholds to the exponents of the floating-point samples to categorize the floating-point samples. The FP2 mode applies one threshold to generate two classes, or "buckets". The FP4 mode applies three thresholds to generate 4 classes, or "buckets". Varying amounts of compression are applied to floating-point samples based on their class.

The image pre-processor (IMPP) 2204 processes various imaging data formats, including:
Red-Green-Blue (RGB)
Intensity & Chroma (YUV)
Image sensor pixels (Bayer matrix)

These imaging data formats are a special integer sub-type. In many imaging subsystems, RGB, YUV, and Bayer samples are stored as interleaved N-bit integers, where N=8, 10, 12, or 16. Conversion between RGB and YUV imaging data formats is performed by averaging color components can optionally resample the chroma (U and V) channels of YUV signals. Decimation may be supported for YUV format, although RGB→YUV conversion may precede YUV chroma downsampling. The image pre-processor 2204 reformats the image samples to a one-dimensional, color component-interleaved stream of integers. The '511 application describes preprocessing operations for the image pre-processor 2204. The source selector 2206 selects the image sample stream for compression by the redundancy remover 2214, based on control parameters received from the controller 2210.

In this embodiment, the redundancy remover (RR) 2214 uses a signed 32-bit integer internal data path, generates two redundancy-removed alternatives and then determines whether the samples themselves, or one of the two redundancy-removed alternatives would result in the best compression. The redundancy remover 2214 calculates the number of bits per compressed packet for each of the alternatives and selects the one having the fewest bits. The alternative selected for the next packet(i+1) may be performed at the end of a current packet(i). The selected alternative is stored in the packet header of next packet(i+1) and will provide a control parameter for decompression operations. The redundancy remover 2214 produces compressed integer samples for the bit packer 2216.

The redundancy remover 2214 may include a center frequency estimator that for 1D signals automatically sets RR-internal control parameters STRIDE1, STRIDE2, ADD_SUB, and FIFO2_SEL based on the estimated center frequency value. For example, a center frequency estimator may select one of six frequency bands: DC, $f_s/8$, $f_s/6$, $f_s/4$, $f_s/3$, and $f_s/2$, where $f_s$ is the sample rate. These bands determine the control parameters STRIDE1, STRIDE2, FIFO2_SEL and ADD_SUB values that control the redundancy remover (RR) 2214 and add/subtract elements. These parameters are further described below. The center frequency estimator operates over a programmable number of input samples (typically 256 or 1024). Aspects of the redundancy remover 2214 are found in commonly owned U.S. Pat. No. 7,009,533 (the '533 patent), entitled "Adaptive Compression and Decompression of Bandlimited Signals, by Albert W. Wegener, which is incorporated by reference, as if fully set forth herein. The redundancy remover 2214 is described in more detail below with respect to FIG. 19.

For input data that does not exhibit a center frequency, such as image data, the redundancy remover (RR) 2214 may operate in manual mode for selecting control parameters STRIDE1, STRIDE2, FIFO2_SEL and ADD_SUB. These control parameters are stored in the BAND DERIV field of each packet header.

The bit packer 2216 may apply block floating point encoding to the compressed integer samples output from the redundancy remover 2214 to form packets of compressed data. The block floating point encoding groups the compressed integer samples and encodes 1 or 2 block exponents with every group of 4 or 8 mantissas. The block exponents (or more specifically, exponent differences) are encoded in pairs when possible and as absolute exponents when they cannot. The exponent tokens are preferably 4 or 8 bits long. The block floating point exponent encoding exploits correlation between the block exponents to minimize the number of bits required to encode them. The exponent tokens are followed by encoded mantissas corresponding to the encoded group. Each of the encoded mantissas in a given encoded group contains the same number of bits, indicated by the block exponent for the group. The '245 application describes embodiments of the block floating point encoding that may be implemented for the bit packer 2216. The header generator 2212 may encode control parameters for a header section of the compressed data packet. FIG. 16 shows an example structure for parameters in a packet header, where the length of the packet header is 32 bits (for integer data) or 48 bits (for floating point data), as described below. A stream of compressed packets may be stored in a ".sfy" file including a file header to store static (unchanging) control parameters, as described with respect to FIG. 18.

Figure 11:
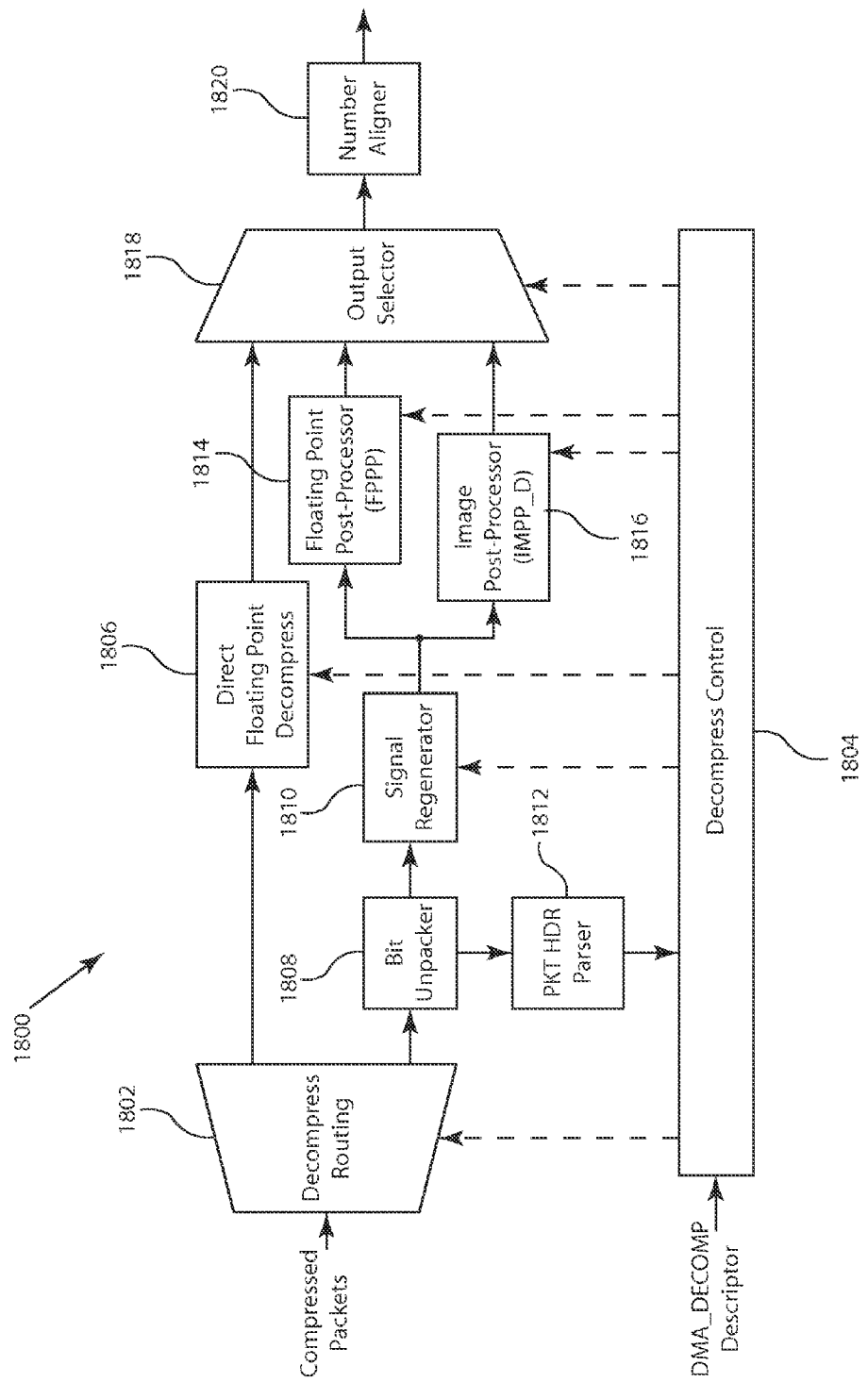
FIG. 11 illustrates a DMA decompressor block diagram according to one embodiment.

FIG. 11 illustrates the decompression engine 1800 according to one embodiment. The decompressor 1800 decodes a stream of compressed packets stored in a ".sfy" file by first accessing any static control parameters in the file header described below with respect to FIG. 18, and then accessing additional control parameters (such as ATTEN, DERIV, STRIDE1, etc.) stored in each compressed data packet header described below with respect to FIG. 16. The decompressor 1800 performs the inverse operations of the compressor 2200, generating the identical or substantially similar samples that the compressor 1800 originally received.

The bit unpacker 1808 decodes each packet header 2100 to extract control parameter information for decompression operations. The bit unpacker 1808 applies block floating point decoding to each packet's compressed groups of exponent tokens and encoded mantissas. The exponent token for the block floating point encoding group indicates the number of bits for each mantissa in the group. The '245 application describes embodiments of the block floating point decoding that may be implemented for the bit unpacker 1808.

The packet header parser 1812 accepts 48 bits representing the parameters stored in the packet header from a parser component of the bit unpacker 1808. After verifying a SYNC word 2101, the packet header parser 1812 retrieves the control parameters STRIDE1 2101, ADD_SUB 2104, DERIV 2105, and INT_OR_FLOAT 2106 fields and distributes them to the decompressor logic blocks that require these parameters. The packet header parser 1812 extracts the various control parameters (such as ATTEN 2101, STRIDE1 2101, ADD_SUB 2104, and DERIV 2105) from each packet header 2100 and configures the signal regenerator 1810 accordingly. The signal regenerator 1810 reverses the derivative and attenuator actions of the redundancy remover (RR) 2214. The signal regenerator 1810 retrieves several of its control parameters from each packet header 2100, including STRIDE1 2101, ADD_SUB 2104, DERIV 2105, and ATTEN 2102. Where the redundancy remover 2214 subtracted samples, signal regenerator 1810 adds them. Where the redundancy remover 2214 added samples, the signal regenerator 1810 subtracts them. Where the redundancy remover 2214 attenuated samples, the signal regenerator 1810 amplifies them. Certain decompressor parameters, such as the IMPP settings for the image pre-processor 2204, color image format, or the direct floating-point compression modes for the direct floating-point compressor 2208, are inferred from the .sfy file header 2410, as described with respect to FIG. 18, since they are not carried by the packet header.

The direct floating point decompressor 1806 decompresses the compressed data, such as from the FP2 and FP4 modes, and reconstructs floating-point data. The '330 application describes decompression to reconstruct the floating-point data for several alternative compression modes that may be implemented by the direct floating-point decompressor 1806.

The floating point post-processor 1814, which receives its input from the signal regenerator 1810, regenerates an approximation to the original floating-point values that were input to the floating point pre-processor 2202.

The image post-processor 1816 regenerates an exact (or approximate) representation of the color components that were input to the image pre-processor 2204. For example, if the image pre-processor 2204 performed chroma downsampling, image post-processor 1816 performs chroma upsampling. If the image pre-processor 2204 performed color space conversion, the image post-processor 1816 performs color space re-conversion. The decompression controller 1804 provides the control parameters to configure the operations of the image post-processor 1816. The control parameters for the image post-processor 1816, such as the color image format, are preferably inferred from parameters stored in the ".sfy" file header for the compressed data, described below, where control parameters in .sfy file header apply to all compressed data packets stored in the .sfy file.

The output selector 1818 selects an input from the direct floating-point decompressor 1806, the floating point post-processor 1814, or image post-processor 1816 and provides the selected data to the number aligner 1820.

The number aligner 1820 accepts 32, 64, 128, or 256 bit units from the output selector 1818 and separates (demultiplexes) them into sample-wide units. The number aligner 1820 uses the control parameter D_TYPE 1905 to properly separate the 32-bit input bits into 1, 2, 4, or ½ sample values, depending on the data type of the output samples and the width of the bus at the output of the number aligner 1820.

Figure 12:
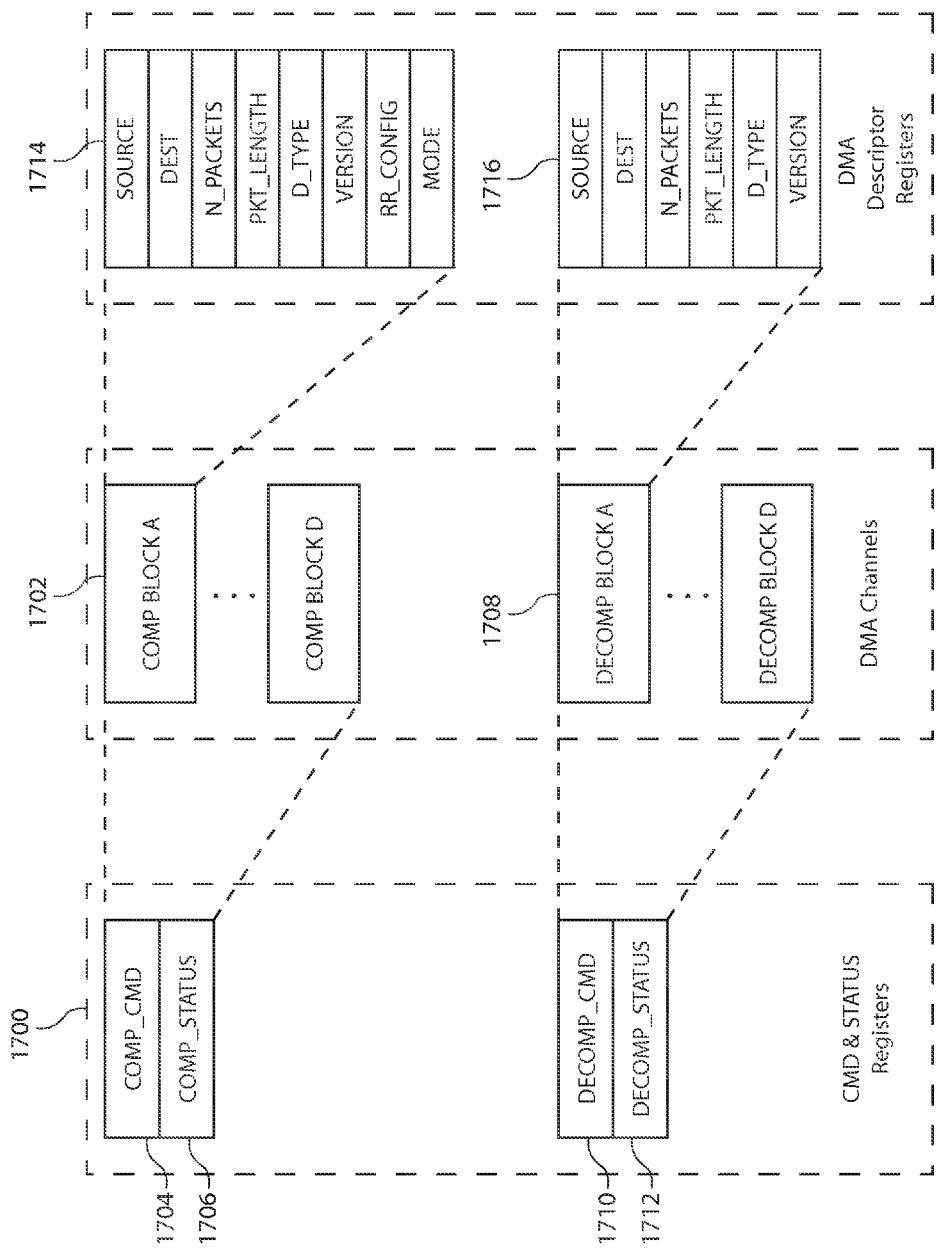
FIG. 12 illustrates the relationship between CMD & STATUS Registers, IP Blocks, and the DMA descriptor according to one embodiment.

FIG. 12 illustrates DMA controller's command and channel descriptors according to one embodiment. Hardware logic blocks, compression COMP BLOCK 1702 and decompression DECOMP BLOCK 1708, are linked one-to-one to compression DMA descriptor 1714 and decompression DMA descriptor 1716. Integrated circuit designers determine how many physical compress and decompress logic blocks (DMA channels) will be instantiated in their design. Each compress or decompress logic block instantiation requires its own dedicated DMA descriptor register set. Before being used for a compress or decompress transaction, all transaction parameters in the corresponding DMA descriptor register set must be initialized.

In CPU software environments, one or more software threads are spawned whenever a user launches a new application. Software threads are terminated when users close applications. Operating systems manage the CPU or GPU hardware resources that threads require, including logic blocks for compression COMP BLOCK 1702 and decompression DECOMP BLOCK 1708 and their associated DMA descriptors. When the number of software threads exceeds the number of physical DMA compress 1702 or decompress 1708 blocks (compress and decompress channels), operating system software or middleware manages a queue of DMA descriptors. Compression and decompression transactions have separate DMA descriptors. The set of parameters of the decompression descriptor 1716 is a subset of the parameters of the compression descriptor 1714.

In the following description, assume that a user has instantiated four COMP BLOCKs 1702 and four DECOMP BLOCKs 1708, a total of 8 DMA resources. To achieve faster processing speed, users can instantiate additional COMP BLOCK 1702 and DECOMP BLOCK 1708 logic blocks, each of which has its own DMA descriptor.

DMA compressor blocks 1702 and decompressor 1708 blocks (channels) are controlled independently using:
  command register (COMP_CMD 1704 and DECOMP_CMD 1710) and
  status register (COMP_STATUS 1706 and DECOMP_STATUS 1712).

Memory writes from a faster memory to a slower memory will usually be compressed, while memory reads from a slower memory to a faster memory will usually be decompressed. Each DMA compress block (channel) 1702 or decompress block (channel) 1708 provides its services for a software thread, and each thread's context is contained in a DMA descriptor associated with that thread.

Similar to DMA descriptors for CPUs, whose DMA controllers operate in parallel with CPU operations, DMA descriptors for compression and decompression engines contain the configuration fields that control compress and decompress operations, described below with respect to FIGS. 14 and 15.

FIG. 13 illustrates compression and decompression command and status registers 1700 according to one embodiment. COMP_CMD 1704 and COMP_STATUS 1706 registers control the four compression blocks 1702, COMP BLOCKs A through D. After all DMA descriptor registers in one of the four compress blocks 1702 have been initialized, the user writes a "1" bit into the COMP_CMD 1704 register to initiate the DMA transaction for the selected DMA descriptor (1 of 4 DMA channels in this example). The COMP_CMD 1704 also includes four interrupt-enable bits. When interrupt enable bits are set for a given COMP BLOCK 1702, the host CPU or GPU will receive an interrupt upon the completion of that block's DMA transaction. Each COMP BLOCK 1702 and DECOMP BLOCK 1708 has its own dedicated bits in the CMD and STATUS registers.

COMP_STATUS 1706 is a read-only register that indicates the state of each compress transaction (idle, busy, or error code).

Similarly, DECOMP_CMD 1710 also includes "trigger" bits and interrupt enable bits for each decompression block (channel), DECOMP BLOCK A through D. Once the decompress DMA descriptor (1 of 4) is initialized, the software thread writes a "1" to the bit corresponding to that DMA descriptor to begin the decompress transaction. As many simultaneous DMA decompress transactions are allowed as DECOMP BLOCKs 1708 are instantiated. DECOMP_STATUS 1712 is a read-only register that indicates the state of each decompress transaction (idle, busy, or error code). When the DECOMP_STATUS 1712 indicates a "SYNC ERROR", that DECOMP BLOCK's DMA descriptor SOURCE register points to the 32-bit word where the SYNC error occurred.

FIG. 14 lists the registers for compression DMA descriptor 1714 according to one embodiment. The SOURCE register 1901 contains the 32-bit or 64-bit start address of the array to be compressed. The DEST register 1902 contains the 32-bit or 64-bit start address where compressed packets will be written. The N_PKTS register 1903 specifies how many packets will be compressed during the transaction, from 1 to 65536. PKT_LENGTH 1903 specifies the number of samples per packet, a multiple of 4 samples from 64 to 16384. Note that PKT_LENGTH 1903 specifies a sample count; the number of bytes to be compressed during the DMA transaction is a function of D_TYPE, PKT_LENGTH, and N_PKTS. For imaging triplets, the packet length is in units of pixels*color planes, i.e. PKT_LENGTH=768 for RGB means that 256*3=768 samples per compressed packet. Similarly, PKT_LENGTH=4320 for Bayer matrix pairs (RGBG) that carry 1080*4=4320 samples per compressed packet.

D_TYPE 1905 specifies the uncompressed data type (input of a COMP transaction, or the output of a DECOMP transaction). D_TYPE bits [15:13] specify six uncompressed data types (uint, int, float, RGB, YUV, or Bayer), while D_TYPE bits [12:10] specify the bit widths (8, 16, 32, or 64 bits) of each uncompressed datum. D_TYPE bits [9:6] specify color image formats. D_TYPE bits [5:4] control optional color space decimation (none, 4:4:4→4:2:2, or 4:4:4→4:2:0). Similarly, color space conversion, such as RGB→YUV conversion, prior to compression is enabled by D_TYPE bits [3:2].

VERSION 1906 specifies the algorithm version number that should be used during the transaction. VERSION 1906 is also stored in the .sfy file header, described below.

RR_CONFIG 1907 configures the redundancy remover (RR) 2214. Three RR parameters (DERIV, ADD_SUB, and STRIDE) can be configured for automatic or manual operation using bits RR_CONFIG[2:0]. A "0" in these bits indicates the parameter will be automatically selected, while a "1" indicates a manual selection. RR_CONFIG bits [15:13] manually select from among six RR_STRIDE1 values (1, 2, 3, 4, 6, or N_FIFO). RR_CONFIG bits [12:10] select manually from among five RR_STRIDE2 values (1, 2, 3, 4, or 6). RR_CONFIG bit [9] manually selects ADD_SUB, while RR_CONFIG bits [8:7] select the manual DERIV value (0, 1, or 2).

MODE 1908 selects from among eight supported compression modes:
  copy from SOURCE to DEST [no compression or decompression],
  lossless mode,
  average rate mode (C_PARAM=target number of 32-bit words per compressed packet),
  constant rate mode (C_PARAM=target number of 32-bit words per compressed packet),
  fixed quality mode (C_PARAM=dynamic range specified in 0.5 dB increments),
  for floating-point data types only:
    FP2 or FP4 fixed rate mode (target number of 32-bit words per packet)
    FP2 or FP4 ABS fixed quality (minimum exponent to quantize to 0.0)
    FP2 or FP4 REL fixed quality (% error, from 0.1% to 99.9%, increments of 0.1%)
  H_DIM (horizontal dimension of 2-D input data)
  V_DIM (vertical dimension of 2-D input data)

FIG. 15 lists the registers for the decompression DMA descriptor 1716 according to one embodiment. The SOURCE register 1901 contains the 32-bit or 64-bit start address of the array to be decompressed. The DEST register 1902 contains the 32-bit or 64-bit start address where decompressed packets will be written. The N_PACKETS register 1903 specifies how many packets will be decompressed during the transaction, from 1 to 65536. PKT_LENGTH 1904 specifies the number of samples per packet, a multiple of 4 samples from 64 to 16384. Note that PKT_LENGTH 1904 specifies a sample count; the number of bytes to be decompressed during the DMA transaction is a function of D_TYPE 1905, PKT_LENGTH 1904, and N_PACKETS 1903. For imaging triplets, the packet length is in units of pixels*color planes, i.e. PKT_LENGTH=768 for RGB means that 256*3=768 samples per decompressed packet. Similarly, PKT_LENGTH=4320 for Bayer matrix pairs (RGBG) that carry 1080*4=4320 samples per decompressed packet.

D_TYPE 1905 specifies the uncompressed data type (input of a COMP transaction, or the output of a DECOMP transaction). D_TYPE bits [15:13] specify six uncompressed data types (uint, int, float, RGB, YUV, or Bayer), while D_TYPE bits [12:10] specify the bit widths (8, 16, 32, or 64 bits) of each uncompressed datum. D_TYPE bits [9:6] specify color image formats, as further described in Section 4.3.1. D_TYPE bits [5:4] control optional color space decimation (none, 4:4:4→4:2:2, or 4:4:4→4:2:0). Similarly, color space conversion, such as RGB→YUV conversion, prior to compression is indicated by D_TYPE bits [32:2].

VERSION 1906 specifies the algorithm version number that should be used during the decompression transaction. VERSION 1906 is stored in the .sfy file header, described below.

FIG. 16 lists the contents of a compressed data packet header 2100 according to one embodiment. The payload portion of a compressed data packet represents compressed data for PKT_LENGTH 1904 uncompressed integers or floating-point values. Packet header fields represent parameters whose value could change with every packet or every few packets. The functions of the parameters in compression and decompression operations are further described below with respect to FIGS. 19 and 20. When a packet carries compressed 32-bit or 64-bit floating-point values, the first 32 bits of each packet header are followed by the floating-point maximum exponent found in this packet, stored in the 16-bit MAX_EXP field 2110. Packet headers thus contain either 32 or 48 bits for this example.

Each compressed packet is aligned on 32-bit doubleword (4-byte) boundaries. Aligning successive compressed packets allows detection of mis-synchronization of compressed packets. Each packet header begins with a 12-bit SYNC word 2101 at PKT_HDR[11:0], allowing the decompressor to detect if any of the previous packet's variable-length packet fields were incorrectly decoded. Since all packets must begin on a 32-bit double word boundary, and must begin with the 12-bit value 0x97F, this allows the detector to both detect synchronization errors and to re-synchronized the compressed packet stream, based on identifying the 0x97F SYNC word 2101 in the proper Dword-aligned location.

Figure 19:
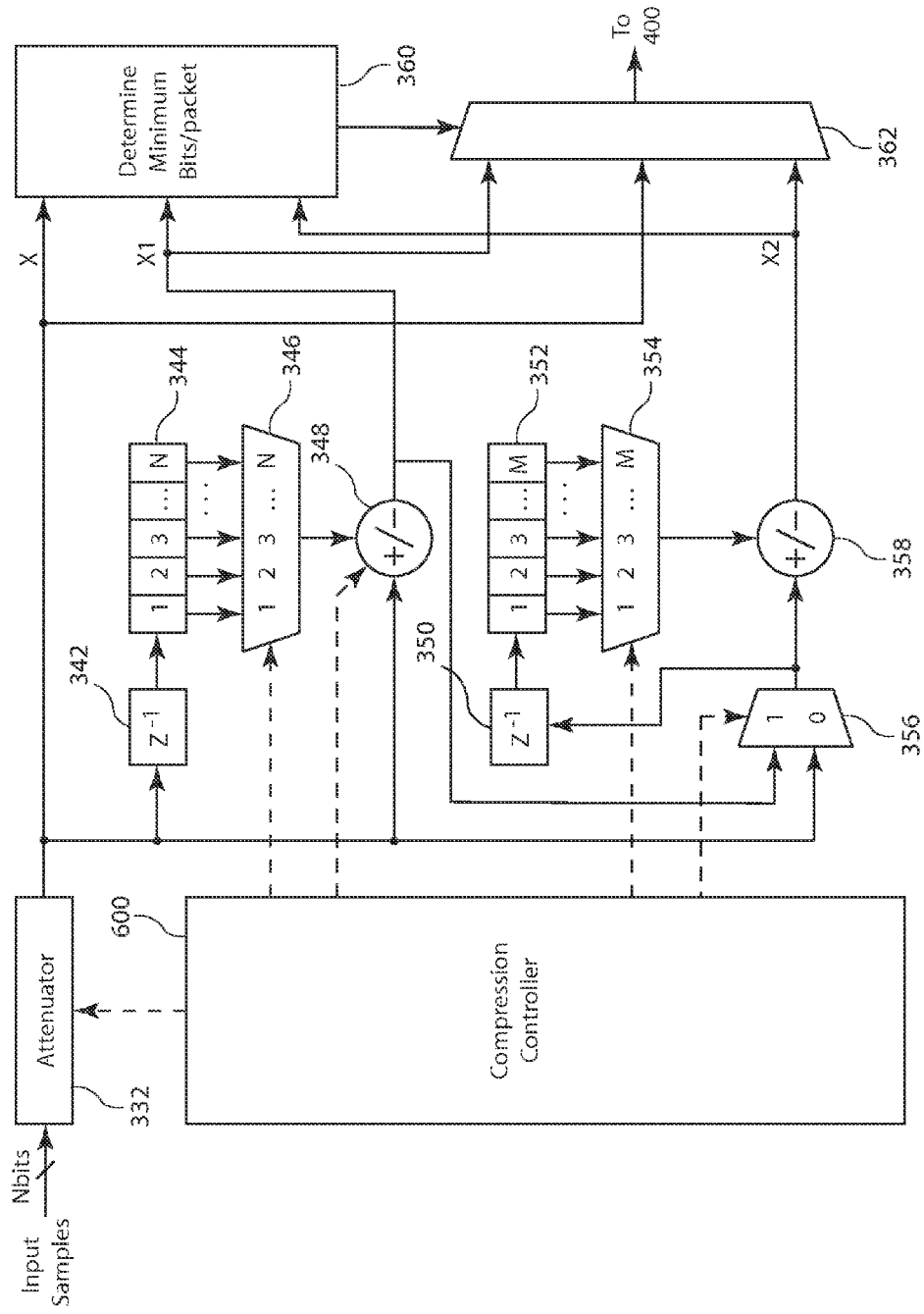
FIG. 19 illustrates an adaptive architecture for the redundancy remover of FIG. 10.
Figure 20:
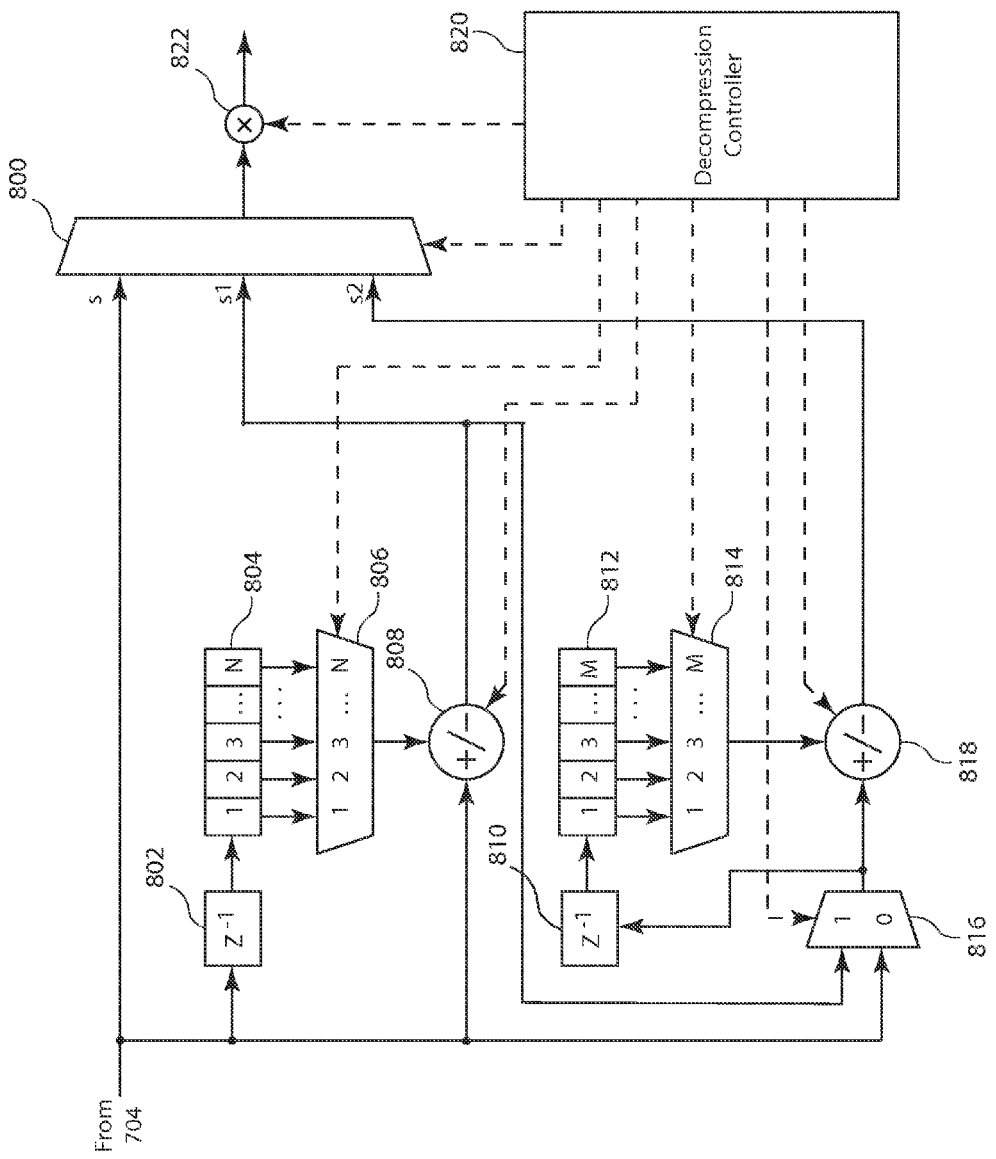
FIG. 20 illustrates an adaptive architecture for the signal regenerator of FIG. 11.

The functions of following parameters are further described with respect to FIG. 19 for compression operations and FIG. 20 for decompression operations.

The nine-bit ATTEN field 2102 (PKT_HDR[21:12]) specifies six integer and four fractional attenuation settings. The four fractional ATTEN bits (.4) are used as a 4-bit address into a 16-entry lookup table that contains a 16-bit integer multiplier.

The STRIDE1 parameter 2103 specifies the FIFO delay or sample separation used by the redundancy remover 2214.

The ADD_SUB bit 2104 controls the operation of the two adder/subtractors (0=subtract, 1=add) used by the redundancy remover 2214. The DERIV field 2105 indicates which stream (1 of 3) is contained in this compressed packet:

DERIV=0: original input samples
DERIV=1: output of adder/subtractor 348 (associated with RR FIFO 344)
DERIV=2: output of adder/subtractor 358 (associated with RR FIFO 352).

The INT_OR_FLOAT bit 2106 indicates whether the MAX_EXP field 2112 (16 bits) is included in the packet header. When INT_OR_FLOAT=0 (integer input data types), MAX_EXP 2112 is not sent and the packet header contains 32 bits. When INT_OR_FLOAT=1 (floating-point input data type), MAX_EXP 2112 is carried in PKT_HDR [47:32] of the packet header.

Figure 17:
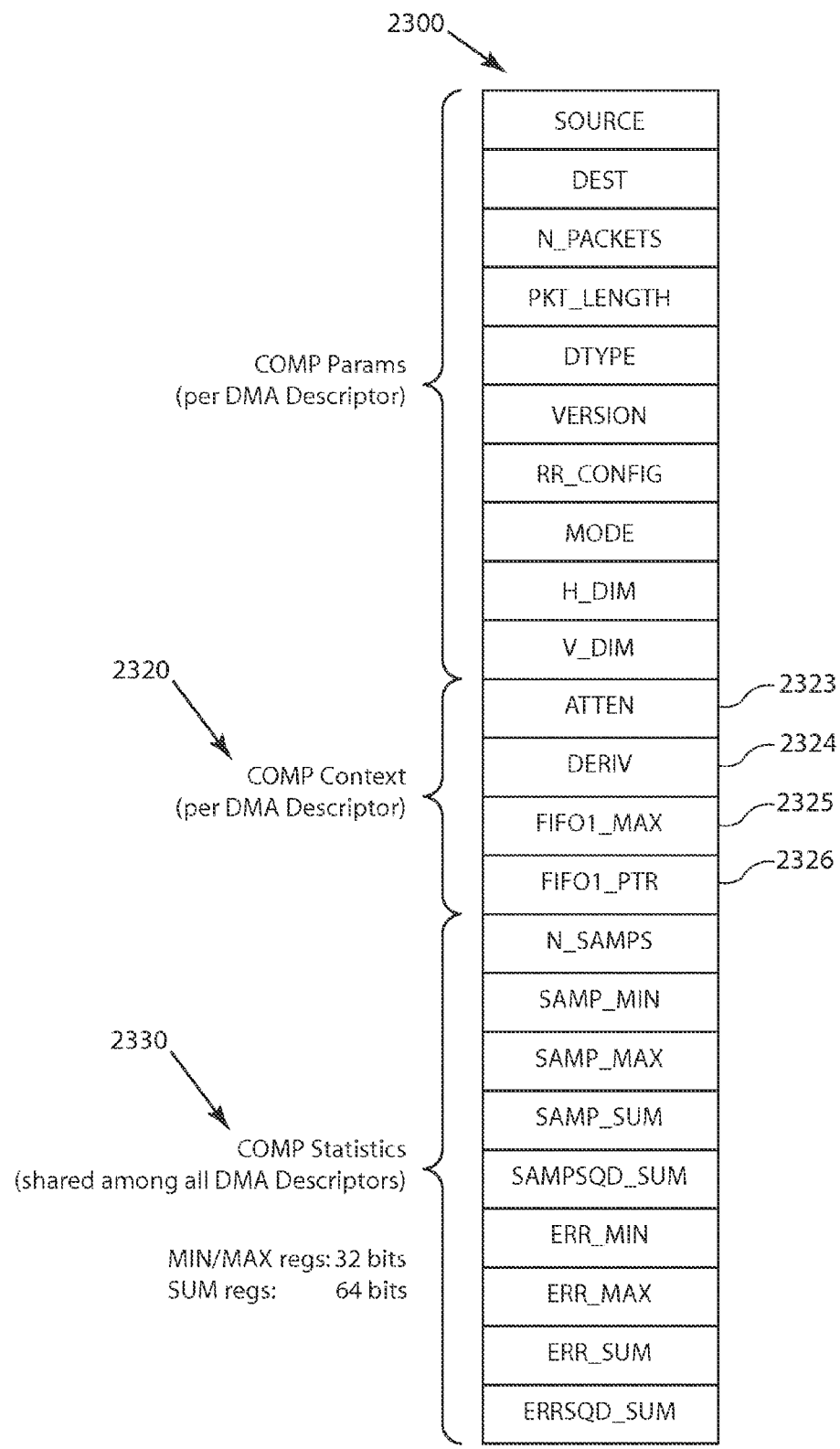
FIG. 17 illustrates a list of compression registers according to one embodiment.

PKT1_IN_FRAME 2108 (PKT_HDR bit [30]) is set (=1) when the packet contains the first samples or color components in a two-dimensional frame, such as for RGB, YUV or Bayer-encoded images or video. For one-dimensional samples and for packets other than the first packet in a 2D frame, PKT1_IN_FRAME 2108 should be clear (=0). PKT_HDR bit [31] 2110 indicates whether the packet payload is followed by a CRC-32 checksum. PKT_HDR[47:32], the MAX_EXP 2112 floating-point normalization value for this packet, is only present if the INT_OR_FLOAT 2106 (PKT_HDR[29:28]) bits indicate that the packet payload carries 32-bit floats or 64-bit floats. PKT_CRC[31:0] 2114 is an OPTIONAL field (enabled via the GEN_CRC32 bit), whose presence after the packet payload is indicated by a "1" in CRC32_FLAG 2110 (PKT_HDR[31]). The CRC-32 checksum is generated on the following packet values:

CRC-32 start location: at SYNC word in packet header, PKT_HDR[11:0]
CRC-32 end location: including the final 32-bit compressed payload Dword FIG. 17 lists compression registers 2300, including four COMP Context registers 2320 and nine COMP Statistics registers 2330. The four COMP Context registers 2320 all save context from the redundancy remover (RR) 2214. "Context" for a DMA_COMP channel means "the last time that an active software thread called this COMP channel, its redundancy remover settings included these four values."

ATTEN 2323 is the 10-bit setting for the attenuator 332 of the redundancy remover 2214. DERIV 2324 is the last chosen derivative order (0, 1, or 2). FIFO1_MAX 2325 is the length in samples of the FIFO buffer 344 used for the application thread, which may be less than or equal to the maximum buffer length N in FIG. 19. FIFO1_PTR 2326 is the pointer into FIFO buffer 344 specifying the FIFO sample that should be correlated with the next input sample in a new DMA_COMP transaction.

The compressor supports several lossy compression modes. In lossy compression modes, the signal statistics registers 2330 in the compressor indicate how much error is introduced during a compress-decompress loop.

The statistics collection block 2330 gathers information on both the input signal and the decompressed signal. The parameter N_SAMPS indicates the number of input samples used for calculating the statistics. Statistics on the input samples includes the minimum sample SAMP_MIN, maximum sample SAMP_MAX, the sum of samples SAMP_SUM and the sum of squared samples SAMPSQD_SUM. Since taking derivatives in the redundancy remover (RR) 2214 and performing bit packing in the bit packer 2216 are both lossless operations, the attenuator 332 is the only source of loss during compression (see FIG. 19). Error computations for the statistics collection block 2330 may be performed after the attenuator 332. The redundancy remover 2214 may amplify the attenuated signal (multiply by the inverse of the attenuation value) to produce the identical signal that the signal regenerator 1810 will generate after the bit unpacking. Subtracting the amplified attenuated signal from the input signal provides an error signal used for the calculating the statistics for the compression statistics registers 2330. The error statistics include minimum error ERR_MIN, maximum error ERR_MAX, sum of errors ERR_SUM and sum of squared errors ERRSQD_SUM. It is also possible to use the input and error signal statistics in an adaptive loop that adjusts various compression parameters to achieve certain signal quality levels.

Compressed packets can be stored in non-persistent memory (SRAM, DRAM) as well as in persistent storage (flash, disk). In non-persistent memory, DMA descriptors (typically also stored in SRAM or DRAM) provide the context for decompressing compressed packets. In persistent storage, DMA descriptors (stored with the thread's compressed packets) provide the same context.

A DMA descriptor provides parameters for a single compress or decompress transaction of one or more packets. Users can specify compress or decompress transactions having:
as few as 32 samples (shortest packet length=32 samples×1 packet), or
as many as $1.074 \times 10^9$ samples (longest packet length=65536 samples×16383 packets).

Due to system constraints (such as block-oriented thread processing), compression and decompression of large sample arrays will typically be divided into multiple DMA transactions.

Figure 18:
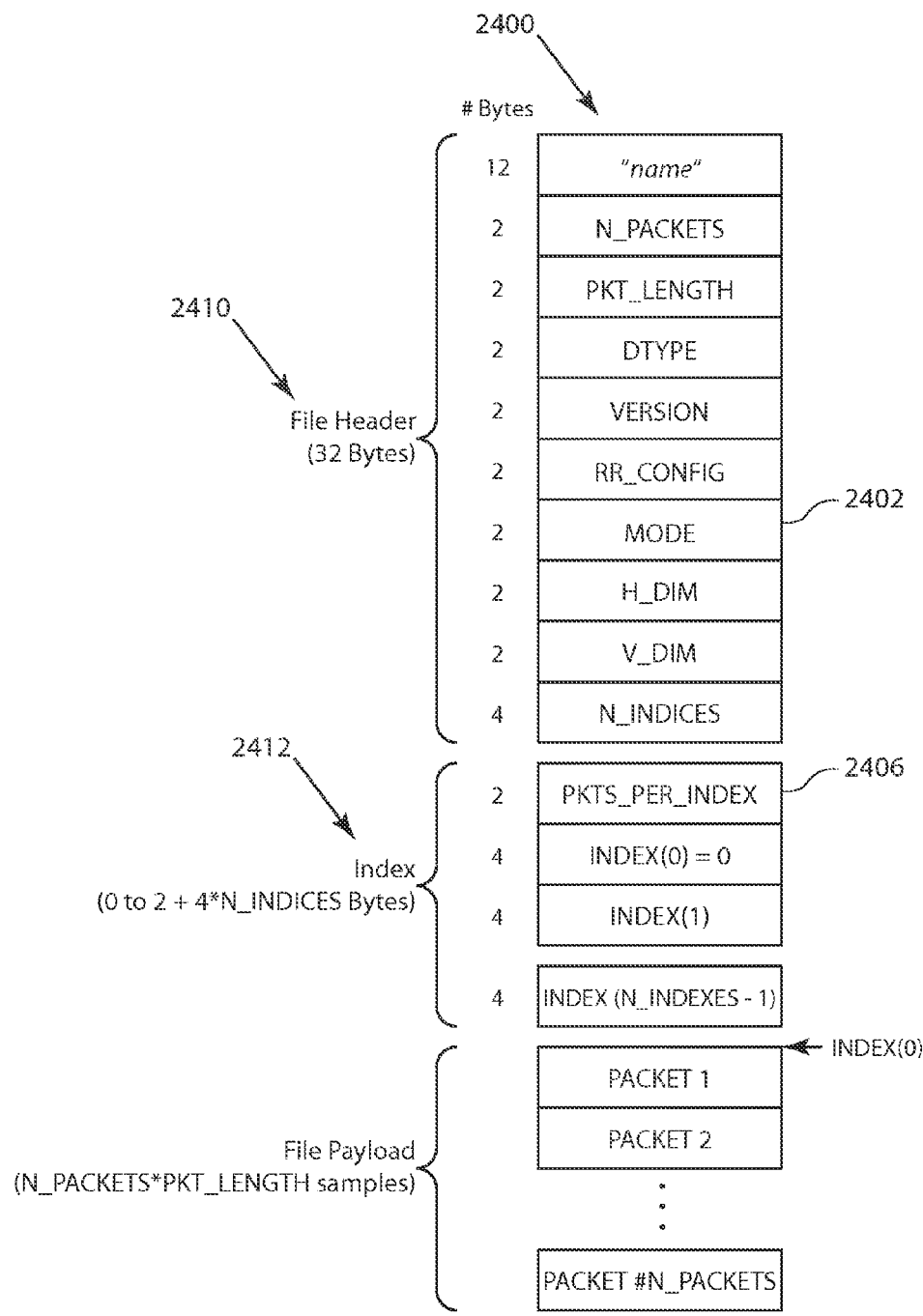
FIG. 18 illustrates a file structure used when DMA parameters are not stored in each packet header but stored instead in a .sfy file header which is written to disk.

FIG. 18 illustrates an example of a file structure for the DMA parameters and compressed packets in a .sfy file 2400 for storing in a storage media, such as disk or flash memory. When the packets are saved to files on flash or disk, certain DMA descriptor parameters that are not already stored in each packet header may be stored in the .sfy file header 2410. Many relevant contextual fields (such as the uncompressed data type, the packet length, and the algorithm version number) are stored in compress DMA descriptors, as shown in FIG. 14, and thus several DMA descriptor fields must be stored with the compressed packets. Without these DMA descriptor parameters, the compressed packets could not properly be recovered. The following DMA compress descriptor fields comprise the .sfy file header 2410:
N_PACKETS (total number of packets in the compressed file)
PKT_LENGTH
D_TYPE
VERSION
RR_CONFIG
MODE 2402
H_DIM (horizontal dimension of 2-D input data)
V_DIM (vertical dimension of 2-D input data)
N_INDICES (number of indices in the index array)

The MODE field 2402 is required because if a compressed file is appended (added to) in the future, the compress block must know what the compression mode was, so that newly compressed packets can be compressed using those same parameters. All of the parameters in the bulleted list above except N_PACKETS cannot change while writing or appending to the compressed file; these parameters listed above are relevant for each and every compressed packet in the .sfy file 2400.

When users desire random access to compressed data to be stored in a .sfy file, compression operations may create an index directory containing index fields 2412 that point to the start of certain compressed packets. If random access is not desired, the .sfy field N_INDICES=0 and the index fields 2412 are not included in the .sfy file 2400. When N_INDICES>0, a parameter called PKTS_PER_INDEX 2406 indicates how many packets occur between index pointers. For instance, indexing every $64^{th}$ packet (PKTS_PER_INDEX=64) of an 8192-packet file (N_PACKETS=8192) results in an index region 2412 having 8192/64=128 indices. PKTS_PER_INDEX 2406 is then followed by 128 64-bit pointers (8 bytes per index). Index[0] points to the SYNC word of the first packet and always equals zero.

Components of the compressor 2200 are described in more detail in the following. The floating point pre-processor 2202 may include float to integer format conversion. The float to integer format converter may normalize a set of input floating-point numbers by using a scale factor to form a set of normalized floating-point numbers. Normalization adapts the range of the fixed-point integer samples to the range of a particular set of input floating-point samples, thus preserving more accuracy. Alternatives for determining the scale factor for the set of input floating-point numbers include the following:
1) Determining the maximum magnitude value (both mantissa and exponent) of the floating-point numbers in the set, f_max, and determining the scale factor F_SCALE using the equation set out below,
2) Using the F_SCALE of a previous set of floating-point numbers for a current set, or
3) Predicting a maximum magnitude value f_max for the current set based on that of one or more previous sets and calculating F_SCALE based on the predicted f_max.

The first option for the scale factor produces scaled floating-point numbers where the maximum magnitude in the set is 1.0 or less, so that floating-point numbers in the set will have values in the range of {−1.0, +1.0}. The second option reduces the computational latency for the current set. After normalization, the float to integer format converter converts the scaled floating-point numbers to integer numbers.

In an alternative embodiment, the float to integer format converter determines the maximum exponent value of the floating-point numbers in the set. For this alternative, the float to integer format converter may provide approximate normalization during format conversion, without a multiplication by the floating-point scale factor F_SCALE. This reduces computational complexity by eliminating the floating-point multiplier. The approximate normalization provides magnitude values less than 2.0 for the set. Alternatives for determining the maximum exponent value for the set include the following:
1) Determining the maximum magnitude exponent value, EXP_SCALE, of the floating-point numbers in the set and providing the EXP_SCALE to the float to integer format converter,
2) Using the maximum magnitude exponent value of a previous set of floating-point numbers for a current set, or predicting a maximum magnitude exponent value for the current set based on that of one or more previous sets, and providing that value as EXP_SCALE to the format converter.

The second alternative reduces the computational latency for the current set.

The float to integer format converter, in accordance with a first embodiment. The input floating-point data are represented in NB bits per sample. The number of bits per integer sample at the output is Nbits. The maximum floating-point value for a set of input floating-point samples, f_max, is determined and the scale factor F_SCALE is calculated as follows, $$F\_SCALE=[2^{(Nbits-1)}-1]/f\_max$$

Each floating-point number in the set is multiplied by F_SCALE to form a scaled floating-point number. Logic to round each scaled floating-point number provides the output integer number. The integer number is represented in a binary two's-complement format having Nbit bits. The two's-complement integer format is used for illustrative purposes. The particular integer format does not limit the scope of the invention, as the floating-point data may be converted to other integer formats.

A second embodiment of the float to integer format converter separately processes the sign bit, exponent bits and mantissa bits to produce an integer in two's-complement format. For IEEE 754 single precision format, the mantissa has NM=23 bits and the exponent has NE=8 bits. For IEEE 754 double precision format, the mantissa has NM=32 bits and the exponent has NE=11 bits. The "hidden bit" is set to "1" for the integer mantissa. The hidden bit corresponds to the leading one of the integer mantissa. The resulting mantissa may provide a positive mantissa, "pos_mant". In two's-complement format, a negative number may be represented by inverting the bits of the positive mantissa and adding "1". Inverting the bits of the positive mantissa and adding "1" to the inverted bits provides a negative mantissa, "neg_mant". The sign value, pos_mant and neg_mant are provided to a selector that selects pos_mant if the sign value is "0" or neg_mant if the sign value is "1". The selected mantissa is right-shifted based on the exponent value, "exp," of the input floating-point number, or alternatively, by the difference of exp and EXP_SCALE. The shift increment corresponding to the exponent value shifts the mantissa bits to the corresponding bit locations for the integer representation. The shift increment corresponding to EXP_SCALE provides the approximate normalization by the value EXP_SCALE, as described above. Alternatively, when the floating-point number has already been scaled by F_SCALE, the EXP_SCALE value is not used. In this case, the exponent value "exp" determines the number of right shifts for the selected mantissa, pos_mant or neg_mant. The resulting sample has a two's-complement integer representation with Nbits per sample. For example, the output integer may have 32 bits. The resulting integer outputs are then compressed by the redundancy remover 2214.

FIG. 19 illustrates an adaptive architecture for the redundancy remover 2214 of FIG. 10, with an attenuator, as used in one example system for integer compression. The controller 2210 of FIG. 10 may include the functionality of the compression controller 600 of FIG. 19. This architecture is configurable to perform sums or differences between samples with selectable sample separations and to determine the sample, sample difference/sum or derivative order providing the minimum bits per packet, or best compression. The attenuator 332 may attenuate the integer sample x(n) by an attenuation factor indicated by the compression controller 600 or no attenuation may be indicated. The attenuator 332 may reduce the magnitude of the integer sample by multiplying by an attenuation factor value less than one or by shifting out a number LSBs (dividing by 2) based on an attenuation factor. Applying the attenuator 332 will result in lossy compression. For the following description, the variable x(n) represents the integer sample with or without attenuation. The FIFO buffer 344 stores N previous samples x(n−1) to x(n−N), where the delay element 342 provides x(n−1). The selector 346 selects a sample x(n−m) with the desired sample separation from the FIFO buffer 344. The add/subtract element 348 computes the sum or difference between the current integer sample x(n) and the selected sample x(n−m) to form a first result $x_1(n)$. If add/subtract element 348 is set to subtract, the result $x_1(n)$ represents a first derivative. When the sample spacing index m=1, the result $x_1(n)$ is the first derivative of adjacent samples. When the third selector 356 is set to "1", the first result $x_1(n)$ is delayed by a second delay element 350 to form $x_1(n-1)$ and provided to a second FIFO buffer 352. The second FIFO buffer 352 may store up to M samples of $x_1$ from $x_1(n-1)$ to $x_1(n-M)$. The second selector 354 selects a sample $x_1(n-p)$ from the second FIFO buffer 352 for input to the second adder/subtractor 358. The third selector 356 provides the other input to the adder/subtractor 358. When the third selector 356 is set to "1", the sample $x_1(n)$ is input to the second adder/subtractor 358. When the second adder/subtractor 358 is configured to subtract, the result is the second derivative $x_2(n)=x_1(n)-x_1(n-p)$. When the sample spacing indices m=1 and p=1, the resulting $x_2(n)$ is the second derivative over adjacent samples. The fourth selector 362 may select the alternative using the fewest bits for the previous packet and provide the respective sample x(n), $x_1(n)$ or $x_2(n)$ to the block floating point encoder 400. The FIFO buffers 344 and 352 store N and M samples, respectively. The sizes N and M may be set to accommodate compression calculations for a range of data formats.

The block 360 includes logic to determine which of alternatives x(n), $x_1(n)$ or $x_2(n)$ for the current packet would produce the least number of bits, or most compression, for a compressed packet. A selection parameter corresponding to the alternative with the most compression is provided to the fourth selector 362 and stored in the packet header of the next packet. The selector 362 applies the selection parameter to samples for the next packet. Determining the selection for the next packet based on the current packet data reduces the latency of compression processing. Alternatively, the selection parameter may be based on the current packet data and stored in the current compressed packet, if the latency to determine the minimum bits per packet is tolerable.

Alternatively, the selection of x(n), $x_1(n)$ or $x_2(n)$ may be made during a training period and fixed for subsequent packets. Alternatively, the selector 362 may use a manually-set selection parameter received from the compression controller 600. When the compression processing uses the block floating point encoder 400, the block 360 logic may determine which of the alternatives x(n), $x_1(n)$ and $x_2(n)$ produces the most compression as follows:

1) For each $i^{th}$ block of N_GROUP samples for a packet, determine the maximum exponent (base 2), or n_exp(i) for each alternative x(n), $x_1(n)$ and $x_2(n)$,
2) Sum the n_exp(i) for all the blocks for a packet to form a total for each alternative, and
3) Select the alternative corresponding to the lowest total.

While the above may not explicitly calculate the exact number of bits per compressed packet for each alternative, the alternative producing the best compression is indicated by the lowest total. Alternatively, the maximum magnitude sample, max(i), in each block N_GROUP samples for each alternative can be substituted for n_exp(i).

The adaptive compressor supports compression of multidimensional data structures or multiplexed data structures. Certain parameter settings for the components in FIG. 19 are appropriate for compression for two-dimensional (2D) data, such as image samples. For example, let N equal the number of samples representing a row of a 2D data set (or an image)

so that a sequence of the integer samples x(n) represents row-ordered samples of two or more rows of the 2D data set, where x(0) to x(N−1) is the first row, x(N) to x(2N−1) is the second row, etc. When the first selector 346 is set to select x(N) and the first adder/subtractor 348 is configured to subtract, the resulting $x_1(n)=x(n)-x(n-N)$ is the difference between corresponding samples in adjacent rows. When the second selector 354 is set to select "1", the third selector 356 is set to select "0", and the second adder/subtractor 358 is configured to subtract, the resulting $x_2(n)=x(n)-x(n-1)$ is the sample difference within the same row. The fourth selector 362 would select the input sample x(n), the row difference sample $x_1(n)$, or the sample difference $x_2(n)$ for block floating point encoding. The fields H_DIM and V_DIM in the DMA descriptor 1714 (FIG. 14) and the .sfy file header (FIG. 18) represent the number of pixels per raster (row) and number of rasters (rows) per frame.

For multiplexed data, a sequence of samples x(n) may represent multiple channels of data, such as data from multiple sensors, multiplexed together to form the sequence. For example, N may represent the number of multiplexed channels, where x(n) to x(n−N+1) represent one sample from each channel at a given time instant and x(n−N) represents two temporally consecutive samples from the same channel. When the first selector 346 is set to select x(n−N) and the first adder/subtractor 348 is configured to subtract, the resulting $x_1(n)=x(n)-x(n-N)$ is the difference between temporally consecutive samples from the same data channel. When the second selector 354 selects samples from a second channel offset from the first channel and the second adder/subtractor 358 is configured to subtract, the difference $x_2(n)=x(n)-x(n-p)$ is the difference between two different channels at a given time instant. The difference between channel data may provide compression when the different channels are correlated. The selector 362 would select the input sample x(n), the intra-channel difference $x_1(n)$, or the inter-channel difference $x_2(n)$ for block floating point encoding.

The adaptive compressor supports compression of data having different center frequencies. As described in the '533 patent, the sample separations and the addition or subtraction operations may be selected to optimally compress the samples based on their center frequency. The pre-processor 330 may include a center frequency detector to determine the center frequency. Techniques for center frequency detection are described in the '533 patent. The center frequency is indicated as a fraction of the sample rate SR. The sample separation parameter may be used by selectors 346 and 354. The selection parameter for the third selector 356 is set to "1" for calculating second order derivatives. The add/subtract configurations apply to both adder/subtractors 348 and 358. The selection of addition or subtraction is related to the positive or negative correlation of the samples separated by the sample separation parameter corresponding to the center frequency.

The fourth selector 362 makes selections of x(n) or $x_1(n)$ to initialize the data for the compressed packet. For initialization, the fourth selector 362 may select the sample x(n) for absolute encoding as the initial sample of the compressed packet. Thus, when the first derivatives or differences $x_1(n)$ are to be encoded for a particular compressed packet, at least the initial sample for the packet will be the absolutely encoded x(n). When the second derivatives $x_2(n)$ are to be encoded for a particular compressed packet, the fourth selector 362 may select the sample x(n) for the initial sample and the first derivative $x_1(n)$ for the second sample of the compressed packet. This initialization may be performed at least once per compressed packet.

The compression controller 600 may provide the parameters for the components of the adaptive compressor architecture, including an attenuation factor for the attenuator 332, the sample separation parameter for the selectors 346 and 354, add/subtract selection parameter for the adder/subtractors 348 and 358 and selection parameter for the third selector 356. The compression controller may store configuration parameters corresponding to multiple data structures in memory. When a particular data structure is to be compressed, the compression controller 600 may retrieve the appropriate parameters and provide them to the corresponding components of the adaptive compressor. Data structure information may include, for example, multidimensional data parameters, multiplexed data parameters or image data parameters such as H_DIM and V_DIM. The compression controller may receive information on center frequency, for example, from a center frequency detector and select the corresponding parameters for the components of the adaptive compressor, as described in the '533 patent.

Referring to FIGS. 10 and 19, the control parameter STRIDE1 refers to the sample separation used by the selector 346 to select the sample x(n−m) from the FIFO buffer 344. The control parameter STRIDE2 refers to the sample separation used by the second selector 354 to selects a sample $x_1(n-p)$ from the second FIFO buffer 352. The control parameter ADD_SUB indicates the operation performed by the adder/subtractor elements 348 and 358. The control parameter DERIV indicates the selection of x(n), x1(n) or x2(n) by the selector 362. The controller 2210 may provide these control parameters to the redundancy remover 2214 and the header generator 2212. The DERIV parameter may be set by the user or determined during compression processing, as described with respect to FIG. 19. The header generator 2210 encodes the control parameters for the header section of the compressed data packet.

Components of the decompressor 2200 are described in the following. FIG. 20 illustrates an adaptive architecture for the signal regenerator 1810 of FIG. 11, as used in one example system for integer decompression. The decompression controller 1804 of FIG. 11 may include the functionality of the decompression controller 820 of FIG. 20. The input to the bit unpacker 1808 applies block floating point decoding to provide decoded samples to the adaptive decompressor. The adaptive decompressor performs sums or differences between decoded samples separated by selectable sample spacings to invert the compression operations. For the following description, the variable s(n) represents a decoded sample output from the BFP decoder of the bit unpacker 1808. The FIFO buffer 804 stores N previous samples s(n−1) to s(n-N) where the delay element 802 provides s(n−1). The selector 806 selects a sample s(n-m) with the desired sample separation from the FIFO buffer 804. The add/subtract element 808 computes the sum or difference between the current decoded sample s(n) and the selected sample s(n-m) to form a first result $s_1(n)$. If add/subtract element 808 is configured to add, the result $s_1(n)$ represents a first integral $s_1(n)=s(n)+s(n-m)$. When the sample spacing index m=1, the result $s_1(n)$ is the first integral of adjacent decoded samples. When the third selector 816 is set to "1", the first result $s_1(n)$ is delayed by a second delay element 810 to form $s_1(n-1)$ and provided to a second FIFO buffer 812. The second FIFO buffer 812 may store up to M samples of $s_1$ from $s_1(n-1)$ to $s_1(n-M)$. The second selector 814 selects a sample $s_1(n-p)$ from the second FIFO buffer 812 for input to the second adder/subtractor 818. The third selector 816 provides the other input to the adder/subtractor 818. When the third selector 816 is set to "1", the sample $s_1(n)$ is input to the second adder/subtractor 818.

When the second adder/subtractor 818 is configured to add, the result is the second integral $s_2(n)=s_1(n)+s_1(n-p)$. When the sample spacing indices m=1 and p=1, the resulting $s_2(n)$ is the second integral over adjacent decoded samples. The fourth selector 800 selects the sample s(n), $s_1(n)$ or $s_2(n)$ indicated by the corresponding decompression parameter and provides the selected sample to the multiplier 822. The multiplier 822 multiplies the selected sample by a gain factor to invert the attenuation factor applied by attenuator 332. Since applying the attenuator 332 produced lossy compression, multiplication by the gain factor will produce an approximation of original sample value. If attenuation was not applied during compression, the gain factor for multiplier 822 is set to "1" or the multiplier is bypassed. The decompression controller 820 may determine the gain factor based on attenuation information (ATTEN) extracted from the compressed packet header. The FIFO buffers 804 and 812 store N and M samples, respectively, to accommodate different data structures, as described above for the integer compression logic 304.

The adaptive decompressor architecture supports decompression of multidimensional data structures or multiplexed data structures using parameter settings described with respect to the adaptive compressor architecture of FIG. 19. For the 2D data set example, where N equals the number of samples representing a row of a 2D data set (or an image), the first selector 806 is set to select s(N) and the first adder/subtractor 808 is configured to add, the resulting $s_1(n)=s(n)+s(n-N)$ sums the decoded samples to reverse the difference operation of adjacent rows performed for compression. When the second selector 814 is set to select "1", the third selector 816 is set to select "0", and the second adder/subtractor 818 is configured to add, the resulting $s_2(n)=s(n)+s(n-1)$ sums decoded samples to reverse the difference operation of samples within the same row performed for compression. For the multiplexed data example described above, N represents the number of multiplexed channels. When the first selector 806 is set to select s(n−N) and the first adder/subtractor 808 is configured to add, the resulting $s_1(n)=s(n)+s(n-N)$ reverses the difference between temporally consecutive samples from the same data channel performed for compression. When the second selector 814 selects samples from the second channel offset from the first channel and the second adder/subtractor 818 is configured to add, the difference $s_2(n)=s(n)+s(n-p)$ reverses the difference between two different channels performed for compression. The fourth selector 800 selects from s(n), $s_1(n)$ or $s_2(n)$ based on the compression parameter from the compressed packet header.

The adaptive decompressor architecture supports decompression of data having different center frequencies. The selectors 806 and 814 select sample spacing and the addition or subtraction operations to reverse the operations performed by the adaptive compressor the samples based on their center frequency. The selection parameter for the third selector 816 is set to "1" for calculating second order integrals. The configurations of the adder/subtractors 808 and 818 reverse the operations of the adder/subtractors 348 and 358.

The fourth selector 800 makes selections of s(n) or $s_1(n)$ corresponding to the initialized data of the compressed packet. When the first derivatives or differences $x_1(n)$ were encoded for a particular compressed packet, at least the initial sample for the packet will be absolutely encoded. For the initial decoded sample from the compressed packet, the fourth selector 800 may select s(n) as the initial sample. The fourth selector 800 would select the first integral $s_1(n)$ for the remaining decoded samples from the compressed packet. When the second derivatives $x_2(n)$ were encoded for a particular compressed packet, the fourth selector 800 may select the sample s(n) for the initial sample and the first integral $s_1(n)$ for the second sample, and the second integral $s_2(n)$ for the remaining decoded samples from the compressed packet. This initialization may be performed at least once for decoded samples from a compressed packet, depending on the initialization performed during compression.

The decompression controller 820 may provide the decompression parameters for the components of the adaptive decompressor, including the gain factor for the multiplier 822, the sample separation parameters for the selectors 806 and 814, add/subtract configuration parameters for the adder/subtractors 808 and 818 and selection parameters for the selectors 816 and 800. The decompression controller 820 may determine the decompression parameters based on the compression parameters extracted from the compressed data packet header. For example, the gain factor may be generated using a lookup table based on the control parameter ATTEN retrieved from the compressed packet header. The samples separation parameters STRIDE 1 and STRIDE2 apply to the selectors 806 and 814, respectively. The ADD_SUB parameter configures the adder/subtractor elements 808 and 818. The DERIV parameter determines the selection of s(n), s1(n) or s2(n) by the selector 800.

Referring to FIG. 11, the floating point post-processor 1814 may apply integer to float format conversion to the decompressed integer samples output from the signal regenerator 1810 to the reconstruct the floating-point data. A first alternative for integer to float format conversion corresponds to the float to integer format converter that uses the F_SCALE factor. This integer to float format conversion implements the following:

$$fp\_samp = int\_samp / F\_SCALE$$

where, "fp_samp" indicates the reconstructed floating-point sample and "int_samp" indicates the decompressed integer sample output from the signal regenerator 1810.

A second embodiment for an integer to float format conversion corresponds to the second embodiment of float to integer format conversion described above. Each input sample comprises the sign and the decompressed integer mantissa in a two's-complement format. An inverter is applied to the decompressed integer mantissa and "1" is added to the inverted mantissa to produce the mantissa, neg_mant, for a negative number. The decompressed integer mantissa provides the mantissa, pos_mant, for a positive number. A selector responds to the sign value to select pos_mant if the sign value is "0" or neg_mant if the sign value is "1". The bit position of the most significant "1" in the decompressed integer mantissa is determined, which is the leftmost nonzero bit that is not a sign extension bit. The bit position, b, is used to determine a left-shift value e_shift by, $$e\_shift = Nbits - 1 - b$$

To reconstruct the mantissa, the selected mantissa left-shifted based on the left-shift value e_shift and the hidden bit is cleared. For the IEEE 754 standard, the reconstructed mantissa would have 23 bits for single precision or 52 bits for double precision. To reconstruct the exponent, the adder 842 computes the difference of e_shift and EXP_SCALE. For the IEEE 754 standard, the reconstructed exponent would have 8 bits for single precision or 11 bits for double precision. Alternatively, when the original floating-point number was scaled by F_SCALE, the EXP_SCALE value is not used. In this case, the e_shift provides the exponent value, exp, and the reconstructed floating-number is divided by F_SCALE. Preferably, the F_SCALE or EXP_SCALE parameter is retrieved from the packet header of the compressed data packet.

Some of the control parameters for the compression modes described above are encoded in the compression DMA descriptor (FIG. 14) and the packet header of the compressed data packet (FIG. 16). For the compression DMA descriptor, the parameters are related as follows:

N_FIFO: corresponds to N in FIGS. 19 and 20.

RR_STRIDE2: corresponds to the sample separation parameter for the selector 354 (FIG. 19) and the selector 814 (FIG. 20).

RR_MANUAL_STRIDE_1: corresponds to a manual setting for the sample separation parameter for the selector 346 (FIG. 19) and the selector 806 (FIG. 20).

RR_MANUAL_ADD_SUB: corresponds to manual settings for the add/subtract elements 348 and 358 (FIG. 19) and the add/subtract elements 808 and 818 (FIG. 20).

RR_MANUAL_DERIV: corresponds to a manual setting of the selection parameter for the selector 362 (FIG. 19) and selector 800 (FIG. 20).

RR_AUTO_MANUAL: corresponds to providing automatic or manual settings for three parameters: sample separation parameter STRIDE1 for the selector 346 (FIG. 19) and the selector 806 (FIG. 20), ADD_SUB settings for the add/subtract elements 348 and 358 (FIG. 19) and the add/subtract elements 808 and 818 (FIG. 20), and DERIV selection parameter for the selector 362 (FIG. 19) and selector 800 (FIG. 20).

ATTEN: corresponds to the attenuation factor for the attenuator 332 in FIG. 19.

For the packet header of the compressed data packet, the parameters are related as follows:

ATTEN: corresponds to the attenuation factor for the attenuator 332 in FIG. 19.

STRIDE 1: corresponds to the sample separation parameter for the selector 346 (FIG. 19) and the selector 806 (FIG. 20).

ADD_SUB: corresponds to settings for the add/subtract elements 348 and 358 (FIG. 19) and the add/subtract elements 808 and 818 (FIG. 20).

DERIV: corresponds to the selection parameter for the selector 362 (FIG. 19) and selector 800 (FIG. 20).

MAX_EXP: corresponds to the EXP_SCALE value used by the floating-point preprocessor 2202 (FIG. 10) and the floating-point postprocessor 1814 (FIG. 11).

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

I claim:

1. A computer system, comprising:
a data processor and memory accessible by the data processor, the memory storing a data set; and
a direct memory access (DMA) controller in communication with the data processor, the DMA controller comprising circuitry to control movement of the data set from a first element of the memory to a second element of the memory, where the second element of the memory has an access latency for accesses by the DMA controller that is longer than that of the first element of the memory, the data processor provides parameters via a DMA descriptor for a data compression procedure by the DMA controller, the parameters including an identifier of the data set to be moved and parameters identifying characteristics of the data compression procedure, the DMA controller including logic to perform data compression according to the parameters identifying the characteristics of the data compression procedure on the data set in the first element of the memory to form a compressed data set, and to store the compressed data set and parameters identifying characteristics of the compressed data set in the second element of the memory, wherein the data compression procedure produces one or more packets of compressed data of the compressed data set, wherein the parameters include indicators of a number of packets and a number of samples per packet in the compressed data set.

2. The system of claim 1, wherein the identifier includes indicators of a compressed data set location in the second element of the memory, an uncompressed data set location in the first element of the memory and a selected compression mode.

3. The system of claim 2, wherein operations of the DMA controller perform data move operations between the compressed data set location and the uncompressed data set location, in which data move operations one of compression and decompression is performed, as specified by the parameters.

4. The system of claim 1, wherein one of the parameters indicates one of a set of data compression modes, the set of data compression modes including at least one lossy mode.

5. The system of claim 1, wherein the identifier of the data set includes an identifier of a data type for the data set to be moved.

6. The system of claim 5, wherein the identifier of a data type identifies one of a supported set of data types, the set including one-dimensional and two-dimensional data types.

7. The system of claim 5, wherein the identifier of a data type identifies one of a supported set of data types, the set including integer data types and floating-point data types.

8. The system of claim 5, wherein the identifier of a data type identifies one of a supported set of data types, and the parameters of the DMA descriptor include a bit width indicator for at least one of the supported set of data types.

9. The system of claim 5, wherein the identifier of a data type identifies one of a supported set of data types, and the parameters of the DMA descriptor include a signed vs. unsigned indicator for at least one of the supported set of data types.

10. The system of claim 5, wherein the identifier of a data type identifies one of a supported set of data types, including a two-dimensional data type and the parameters of the DMA descriptor include indicators of a number of samples per row and a number of samples per column for the two-dimensional data type.

11. The system of claim 5, wherein the identifier of a data type identifies one of a supported set of data types, including a two-dimensional data type and the parameters of the DMA descriptor include indicators of a color encoding selection for the two-dimensional data type.

12. The system of claim 1, wherein the parameters identifying characteristics of a data compression procedure support a set of different algorithms selectable by the parameters, a selected one of the different algorithms specified by corresponding parameters of the DMA descriptor is applied for the data compression procedure.

13. The system of claim 12, wherein the set of different algorithms includes algorithms specialized for data types identified in the parameters of the DMA descriptor.

14. The system of claim 12, wherein the set of different algorithms includes an algorithm for compression of floating-point numbers and an algorithm for compression of integers.

15. The system of claim 12, wherein the set of different algorithms includes an algorithm for compression of image data.

16. The system of claim 12, wherein the set of different algorithms includes an algorithm specialized for lossless compression and an algorithm specialized for lossy compression.

17. The system of claim 12, wherein the set of different algorithms includes an algorithm specialized to achieve a compression ratio specified by one of the parameters of the DMA descriptor.

18. The system of claim 12, wherein the set of different algorithms includes an algorithm specialized to achieve a compression quality, specified by one of the parameters of the DMA descriptor.

19. A computer system, comprising:
a data processor and memory accessible by the data processor, the memory storing a data set; and
a direct memory access (DMA) controller in communication with the data processor, the DMA controller comprising circuitry to control movement of the data set from a first element of the memory to a second element of the memory, where the second element of the memory has an access latency for accesses by the DMA controller that is longer than that of the first element of the memory, the data processor provides parameters via a DMA descriptor for a data compression procedure by the DMA controller, the parameters including an identifier of the data set to be moved and parameters identifying characteristics of the data compression procedure, the DMA controller including logic to perform data compression according to the parameters identifying the characteristics of the data compression procedure on the data set in the first element of the memory to form a compressed data set, and to store the compressed data set and parameters identifying characteristics of the compressed data set in the second element of the memory,
wherein the data processor provides parameters via a decompression DMA descriptor for a data decompression procedure by the DMA controller, the decompression DMA descriptor parameters including an identifier of the data set to be moved, an indicator of a compressed data set location in the second element of memory, and an indicator of a decompressed data set location in the first element of memory, the DMA controller including logic, to perform data decompression according to identified characteristics of the data decompression procedure on the compressed data set in the second element of the memory to form a decompressed data set, and to store the decompressed data set in the first element of the memory.

20. The system of claim 19, wherein at least one parameter identifying at least one characteristic of the data decompression procedure is included within the compressed data set stored in the second element of the memory.

21. The system of claim 19, wherein at least one parameter identifying at least one characteristic of the data decompression procedure is stored in a separate file in the second element of memory.

22. The system of claim 19, wherein the data compression procedure produced one or more packets of compressed data of the compressed data set, the decompression DMA descriptor parameters including indicators of a number of packets and a number of samples per packet in the compressed data set, wherein at least one of the packets stores at least one identifier of at least one characteristic of the data decompression procedure.

23. The system of claim 19, wherein respective packets contain respective parameters identifying the characteristics of the data decompression procedure for the respective packet, the DMA controller to apply the data decompression procedure to the compressed data of the respective packet in accordance with the respective parameter.

24. A method for transferring a data set between a first element of a memory and a second element of the memory comprising:
initiating a data compression procedure in a direct memory access (DMA) controller in communication with a data processor and the memory, where the second element of the memory has an access latency for accesses by the DMA controller that is longer than that of the first element of the memory;
passing an identifier of an uncompressed data set in the first element of the memory from the data processor to the DMA controller;
passing parameters identifying characteristics of a data compression procedure to be applied to the uncompressed data set from the data processor to the DMA controller;
retrieving the uncompressed data set from the first element of the memory in accordance with the identifier;
compressing the uncompressed data set according to the identified characteristics of the data compression procedure to form a compressed data set; and
storing the compressed data set in the second element of the memory,
wherein said compressing produces one or more packets of compressed data of the compressed data set, wherein the parameters include indicators of a number of packets and a number of samples per packet in the compressed data set.

25. The method of claim 24, wherein the identifier of the uncompressed data set includes indicators of an uncompressed data set location in the first element of memory and compressed data set location in the second element of memory.

26. The method of claim 24, wherein the step of storing the compressed data set includes storing at least one parameter identifying a characteristic of a decompression procedure within the compressed data set stored in the second element of the memory.

27. The method of claim 24, wherein the step of storing the compressed data set includes storing at least one parameter identifying a characteristic of a decompression procedure for the compressed data set in a separate file in the second element of the memory.

28. The method of claim 24, wherein the step of storing the compressed data set in the second element of the memory includes storing parameters determined during said compressing within the compressed data set stored in the second element of the memory.

29. The method of claim 24, wherein the step of compressing the uncompressed data set applies a lossy compression mode in accordance with at least one of the parameters.

30. The method of claim 24, wherein the step of compressing the uncompressed data set applies a lossless compression mode in accordance with at least one of the parameters.

31. The method of claim 24, wherein the parameters identifying characteristics of a data compression procedure support a set of different algorithms selectable by the parameters, wherein said compressing applies a selected one of the different algorithms in accordance with corresponding parameters.

32. The method of claim 31, wherein the set of different algorithms includes algorithms specialized for data types identified for the uncompressed data set.

33. The method of claim 31, wherein the set of different algorithms includes an algorithm for compression of floating-point numbers and an algorithm for compression of integers.

34. The method of claim 31, wherein the set of different algorithms includes an algorithm for compression of image data.

35. The method of claim 31, wherein the set of different algorithms includes an algorithm specialized for lossless compression and an algorithm specialized for lossy compression.

36. The method of claim 31, wherein the set of different algorithms includes an algorithm specialized to achieve a compression ratio, specified by one of the parameters.

37. The method of claim 31, wherein the set of different algorithms includes an algorithm specialized to achieve a compression quality, specified by one of the parameters.

38. The method of claim 24, wherein the identifier of the uncompressed data set includes an identifier of a data type.

39. The method of claim 38, wherein the identifier of a data type identifies one of a supported set of data types, the set including one-dimensional and two-dimensional data types.

40. The method of claim 38, wherein the identifier of a data type identifies one of a supported set of data types, the set including integer data types and floating-point data types.

41. The method of claim 38, wherein the identifier of a data type identifies one of a supported set of data types, and the parameters include a bit width indicator for at least one of the supported set of data types.

42. The method of claim 38, wherein the identifier of a data type identifies one of a supported set of data types, and the parameters include a signed vs. unsigned indicator for at least one of the supported set of data types.

43. The method of claim 38, wherein the identifier of a data type identifies one of a supported set of data types, including a two-dimensional data type and the parameters include indicators of a number of samples per row and a number of samples per column for the two-dimensional data type.

44. The method of claim 38, wherein the identifier of a data type identifies one of a supported set of data types, including a two-dimensional data type and the parameters include indicators of a color encoding selection for the two-dimensional data type.

45. A method for transferring a data set between a first element of a memory and a second element of the memory comprising:

initiating a data compression procedure in a direct memory access (DMA) controller in communication with a data processor and the memory, where the second element of the memory has an access latency for accesses by the DMA controller that is longer than that of the first element of the memory;

passing an identifier of an uncompressed data set in the first element of the memory from the data processor to the DMA controller;

passing parameters identifying characteristics of a data compression procedure to be applied to the uncompressed data set from the data processor to the DMA controller;

retrieving the uncompressed data set from the first element of the memory in accordance with the identifier;

compressing the uncompressed data set according to the identified characteristics of the data compression procedure to form a compressed data set;

storing the compressed data set in the second element of the memory; and transferring a compressed data set to be decompressed from the second element to the first element of the memory, comprising:

initiating a data decompression procedure in the DMA controller;

passing an identifier of the compressed data set to be decompressed from the data processor to the DMA controller;

retrieving the compressed data set from the second element of the memory in accordance with the identifier of the compressed data set to be decompressed;

retrieving a parameter identifying at least one characteristic of a data decompression procedure from the second element of the memory;

decompressing the compressed data set according to the identified characteristic of the data decompression procedure to produce a decompressed data set; and storing the decompressed data set in the first element of the memory.

46. The method of claim 45, wherein the identifier of the compressed data set to be decompressed includes indicators of a compressed data set location in the second element of the memory and a decompressed data set location in the first element of the memory.

47. The method of claim 45, wherein the step of retrieving the parameter identifying at least one characteristic of the decompression procedure includes retrieving the parameter from within the compressed data set stored in the second element of the memory.

48. The method of claim 45, wherein the step of retrieving the parameter identifying at least one characteristic of the decompression procedure includes retrieving the parameter from a file in the second element of the memory.

49. The method of claim 45, wherein the data compression procedure produces one or more packets of compressed data of the compressed data set, the identifier of the compressed data set to be decompressed including indicators of a number of packets and a number of samples per packet in the compressed data set, wherein at least one of the packets stores the parameter identifying at least one characteristic of the data decompression procedure.

50. The method of claim 49, wherein respective packets contain respective parameters identifying the characteristics of the data decompression procedures to be applied to the respective packets, wherein said retrieving a parameter retrieves the respective parameters from the respective packets and said decompressing applies the data decompression procedure to the compressed data of the respective packet in accordance with the respective parameter.

* * * * *